(12) United States Patent
Kim

(10) Patent No.: US 9,589,814 B2
(45) Date of Patent: Mar. 7, 2017

(54) SEMICONDUCTOR DEVICE PACKAGES AND METHODS OF MANUFACTURING THE SAME

(71) Applicant: Samsung Electronics Co., Ltd., Suwon-Si, Gyeonggi-Do (KR)

(72) Inventor: Che-heung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/332,922

(22) Filed: Jul. 16, 2014

(65) Prior Publication Data

US 2015/0155217 A1 Jun. 4, 2015

(30) Foreign Application Priority Data

Dec. 4, 2013 (KR) .................. 10-2013-0149995

(51) Int. Cl.
*H01L 23/34* (2006.01)
*H01L 21/48* (2006.01)
(Continued)

(52) U.S. Cl.
CPC ...... *H01L 21/4821* (2013.01); *H01L 23/4334* (2013.01); *H01L 23/49537* (2013.01);
(Continued)

(58) Field of Classification Search
CPC ............ H01L 21/4821; H01L 21/4825; H01L 23/49562; H01L 23/4334; H01L 23/49537;
(Continued)

(56) References Cited

U.S. PATENT DOCUMENTS 4,649,637 A * 3/1987 Hatakeyama ....... H01L 23/3121
257/675
6,980,462 B1 * 12/2005 Ramesh ................. G11C 5/063
257/E27.081
(Continued)

FOREIGN PATENT DOCUMENTS

JP 09-312372 2/1997
JP 4055700 B2 3/2008
(Continued)

OTHER PUBLICATIONS

Machine translation, Nishiyama, Japanese Patent Publocation No. 2010-212727, translation date: Dec. 30, 2015, JPO & Japio, all pages.*

*Primary Examiner* — Victoria K Hall
(74) *Attorney, Agent, or Firm* — Harness, Dickey & Pierce, P.L.C.

(57) ABSTRACT

A semiconductor device package may include: a semiconductor chip element; and a supporting structure on which the semiconductor chip element is mounted and including an electrical connection element for connecting the semiconductor chip element to an external terminal. The supporting structure may include: a first lead frame including a heat dissipation element; a second lead frame coupled to the first lead frame; and/or an insulator configured to electrically insulate the first and second lead frames from each other. Each of the first and second lead frames may include a mounting region on which the semiconductor chip element is mounted. The first lead frame may include: a first portion; and/or a second portion formed on the first portion and having a smaller width than that of the first portion. The insulator may be on the first portion around the second portion. The second lead frame may be on the insulator.

25 Claims, 23 Drawing Sheets

(51) Int. Cl.
*H01L 23/433* (2006.01)
*H01L 23/495* (2006.01)
*H01L 23/31* (2006.01)
*H01L 23/00* (2006.01)

(52) U.S. Cl.
CPC .. *H01L 23/49541* (2013.01); *H01L 23/49551* (2013.01); *H01L 23/49562* (2013.01); *H01L 23/49568* (2013.01); *H01L 23/49582* (2013.01); *H01L 23/49586* (2013.01); *H01L 23/3121* (2013.01); *H01L 24/73* (2013.01); *H01L 2224/0603* (2013.01); *H01L 2224/16245* (2013.01); *H01L 2224/32245* (2013.01); *H01L 2224/48247* (2013.01); *H01L 2224/48257* (2013.01); *H01L 2224/49111* (2013.01); *H01L 2224/73265* (2013.01); *H01L 2924/00014* (2013.01); *H01L 2924/1032* (2013.01); *H01L 2924/10253* (2013.01)

(58) Field of Classification Search
CPC ........... H01L 23/4954; H01L 23/49551; H01L 23/49568; H01L 23/49582; H01L 23/49586; H01L 23/49565; H01L 23/34; H01L 23/28; H01L 29/20
USPC .................. 257/666, 675, 712, 773, 796; 438/121–124
See application file for complete search history.

(56) References Cited

U.S. PATENT DOCUMENTS

| | | | |
|---|---|---|---|
| 7,285,846 B1* | 10/2007 | Tran | H01L 23/495 257/666 |
| 7,466,012 B2 | 12/2008 | Standing et al. | |
| 7,656,033 B2 | 2/2010 | Koenigsberger et al. | |
| 8,404,508 B2 | 3/2013 | Lidow et al. | |
| 8,436,429 B2 | 5/2013 | Xue et al. | |
| 8,679,896 B2* | 3/2014 | Joshi | H01L 23/49548 257/666 |
| 9,437,508 B2* | 9/2016 | Tanaka | H01L 23/4334 |
| 2002/0109211 A1* | 8/2002 | Shinohara | H01L 23/4334 257/666 |
| 2004/0188676 A1* | 9/2004 | Osuga | H01L 23/293 257/40 |
| 2004/0232545 A1* | 11/2004 | Takaishi | H01L 23/3107 257/707 |
| 2005/0151231 A1* | 7/2005 | Yoshida | H01L 33/62 257/669 |
| 2005/0287711 A1* | 12/2005 | Huang | H01L 23/49861 438/123 |
| 2006/0197207 A1* | 9/2006 | Chow | H01L 23/49575 257/686 |
| 2006/0261473 A1* | 11/2006 | Connah | H01L 23/15 257/728 |
| 2009/0057852 A1* | 3/2009 | Madrid | H01L 23/4334 257/670 |
| 2009/0166850 A1* | 7/2009 | Jeon | H01L 23/49562 257/706 |
| 2009/0269885 A1* | 10/2009 | Madrid | H01L 23/4334 438/119 |
| 2010/0016473 A1* | 1/2010 | Kaji | C08G 59/245 523/400 |
| 2011/0003432 A1* | 1/2011 | Noquil | H01L 23/3107 438/108 |
| 2011/0241054 A1* | 10/2011 | Lee | F21K 9/00 257/98 |
| 2012/0211759 A1* | 8/2012 | Liu | H01L 21/02381 257/76 |
| 2012/0248539 A1* | 10/2012 | Zhang | H01L 23/49503 257/368 |
| 2014/0001617 A1* | 1/2014 | Shi | H01L 24/32 257/676 |
| 2014/0306330 A1* | 10/2014 | Williams | H01L 23/49541 257/675 |
| 2015/0155377 A1 | 6/2015 | Kim | |

FOREIGN PATENT DOCUMENTS

| | | | |
|---|---|---|---|
| JP | 4173751 B2 | 10/2008 | |
| JP | 2010-212727 | * 9/2010 | ............ H01L 23/34 |
| KR | 2015-0064603 A | 6/2015 | |

* cited by examiner

< COMPARATIVE EXAMPLE >

AC L @ 1MHz $\begin{pmatrix} L_{d1} & L_M \\ L_M & L_{s1} \end{pmatrix} = \begin{pmatrix} 3.8692 & -2.0046 \\ -2.0046 & \boxed{4.6494} \end{pmatrix} nH$ AC R @ 1MHz $\begin{pmatrix} R_{d1} & R_M \\ R_M & R_{s1} \end{pmatrix} = \begin{pmatrix} 1.0921 & 0.013704 \\ 0.013704 & 0.99993 \end{pmatrix} m\Omega$

< EXAMPLE EMBODIMENT >

AC L @ 1MHz $\begin{pmatrix} L_{d1} & L_M \\ L_M & L_{s1} \end{pmatrix} = \begin{pmatrix} 0.16566 & -0.028046 \\ -0.028046 & 0.4942 \end{pmatrix} nH$ AC R @ 1MHz $\begin{pmatrix} R_{d1} & R_M \\ R_M & R_{s1} \end{pmatrix} = \begin{pmatrix} 57.652 & 5.442 \\ 5.442 & 154.55 \end{pmatrix} \mu\Omega$

SEMICONDUCTOR DEVICE PACKAGES AND METHODS OF MANUFACTURING THE SAME

CROSS-REFERENCE TO RELATED APPLICATION(S)

This application claims priority from Korean Patent Application No. 10-2013-0149995, filed on Dec. 4, 2013, in the Korean Intellectual Property Office (KIPO), the entire contents of which are incorporated herein by reference.

BACKGROUND

1. Field

Some example embodiments may relate to semiconductor device packages. Some example embodiments may relate to methods of manufacturing semiconductor device packages.

2. Description of Related Art

Semiconductor device packages may be largely divided into two groups, a group for high speed/high frequency operations and a group for high power handling. Semiconductor device packages for high speed/high frequency operations may have been developed to reduce a parasitic component for a high speed operation, such as a parasitic inductance, and may be vulnerable to high current driving. Semiconductor device packages for high power handling may have been developed to improve a heat dissipation characteristic for high current driving, and may be relatively disadvantageous in terms of operating speed. It may be difficult to manufacture a semiconductor device package that satisfies both high current driving and high speed/high frequency operation characteristics.

Meanwhile, for actual applications of diverse semiconductor devices that have been recently studied and developed, development of packages suitable for characteristics of each device is necessary. In this regard, various requirements need to be taken into consideration. For example, a field effect transistor (FET) using a Group III-V based compound semiconductor may be advantageous in a variety of ways, such as exhibiting a large increase in efficiency of a system because of a low switching loss due to low conduction loss and fast switching characteristics, a possibility of volume reduction of a passive component due to a high operating frequency, and a low temperature dependence according to a wide bandgap characteristic. However, for actual applications of such semiconductor devices, it may be required to develop packages most suitable to characteristics of devices, and various requirements, for example, high speed operation, high power handling, securing of a withstand voltage characteristic, convenience of manufacturing, high throughput, small package size, etc., may need to be taken into consideration.

SUMMARY

Some example embodiments may provide semiconductor device packages satisfying high power/high current driving and high speed/high frequency operating characteristics.

Some example embodiments may provide semiconductor device packages having an excellent heat dissipation characteristic and a small electric parasitic component.

Some example embodiments may provide semiconductor device packages that are advantageous in terms of an improvement of a withstand voltage characteristic.

Some example embodiments may provide semiconductor device packages that are easily manufactured, are advantageous in terms of an improvement of throughput, and have a relatively small size.

Some example embodiments may provide semiconductor device packages suitable for a device including a Group III-V based material (for example, a GaN base material).

Some example embodiments may provide semiconductor device packages suitable for a device that applies a Group III-V based material (for example, a GaN base material) to a single crystalline substrate (for example, a silicon substrate).

Some example embodiments may provide methods of manufacturing the semiconductor device packages.

In some example embodiments, a semiconductor device package may comprise: a semiconductor chip element; and/or a supporting structure on which the semiconductor chip element is mounted and comprising an electrical connection element for connecting the semiconductor chip element to an external terminal. The supporting structure may comprise: a first lead frame comprising a heat dissipation element; a second lead frame coupled to the first lead frame; and/or an insulator configured to electrically insulate the first and second lead frames. Each of the first and second lead frames may comprise a mounting region on which the semiconductor chip element is mounted.

In some example embodiments, the semiconductor chip element may be on one side with respect to the first and second lead frames.

In some example embodiments, a part of the first lead frame may overlap with a part of the second lead frame.

In some example embodiments, a part of the second lead frame may be between the first lead frame and the semiconductor chip element.

In some example embodiments, the first lead frame may comprise: a first portion and a second portion formed on the first portion and having a smaller width than that of the first portion. The insulator may be on the first portion around the second portion. The second lead frame may be on the insulator.

In some example embodiments, the second lead frame may comprise a plurality of frame elements around the second portion of the first lead frame. The plurality of frame elements may be electrically separated from each other.

In some example embodiments, the plurality of frame elements may comprise: first and second frame elements facing each other with the second portion of the first lead frame between the first and second frame elements; and/or a third frame element on one side with respect to the first and second frame elements.

In some example embodiments, the insulator may comprise: a first portion extending in a first direction; a second portion spaced apart from the first portion and in parallel to the first portion; and/or a third portion configured to connect an end of the first portion and an end of the second portion.

In some example embodiments, the insulator may comprise resin.

In some example embodiments, the resin may comprise at least one of epoxy, liquid crystal polymer (LCP), polyimide (PI), polycarbonate (PC), and polyethylene terephthalate (PET).

In some example embodiments, the semiconductor chip element may be mounted on the supporting structure in a flip-chip manner.

In some example embodiments, the first lead frame may comprise a first mounting region. The second lead frame may comprise a plurality of second mounting regions around the first mounting region.

In some example embodiments, at least one first conductor may be on the first mounting region. A plurality of second conductors may be on the plurality of second mounting regions. The semiconductor chip element may be mounted on the first and second conductors.

In some example embodiments, a resin layer may be on the first mounting region. A plurality of conductors may be on the plurality of second mounting regions. The semiconductor chip element may be mounted on the resin layer and the plurality of conductors.

In some example embodiments, the resin layer may have thermal conductivity greater than or equal to about 1 W/(m·K).

In some example embodiments, the resin layer may have thermal conductivity greater than or equal to about 5 W/(m·K).

In some example embodiments, semiconductor chip element may be configured as a single chip.

In some example embodiments, the single chip may have a structure in which a plurality of devices are monolithically integrated on a single substrate.

In some example embodiments, the semiconductor chip element may comprise a plurality of chips.

In some example embodiments, the semiconductor device package may further comprise: an encapsulant covering the semiconductor chip element and a portion of the supporting structure. At least a portion of the heat dissipation element may not be covered by the encapsulant so as to be exposed.

In some example embodiments, the semiconductor device package may further comprise: an external heat sink. The external heat sink may be configured to contact an exposed portion of the heat dissipation element that is not covered by the encapsulant.

In some example embodiments, the supporting structure may comprise a plurality of connection pins. The plurality of connection pins may be such that contact surfaces of the plurality of connection pins face a direction in which the semiconductor chip element is formed with respect to the heat dissipation element.

In some example embodiments, the supporting structure may comprise a plurality of connection pins. The plurality of connection pins may be such that contact surfaces of the plurality of connection pins face a direction in which the heat dissipation element is formed with respect to the semiconductor chip element.

In some example embodiments, the semiconductor chip element may comprise a power device.

In some example embodiments, the semiconductor chip element may comprise a gallium nitride based device on a silicon substrate.

In some example embodiments, a semiconductor device package may comprise: a semiconductor chip element and a supporting structure on which the semiconductor chip element is mounted. The semiconductor chip element may comprise a silicon substrate and a Group III-V based device unit on the silicon substrate. The supporting structure may comprise a heat dissipation element and a conductive connection unit on the heat dissipation element. The conductive connection unit may be between the heat dissipation element and the Group III-V based device unit. The Group III-V based device unit may be between the conductive connection unit and the silicon substrate.

In some example embodiments, the supporting structure may comprise: a first lead frame comprising the heat dissipation element; a second lead frame coupled to the first lead frame; and/or an insulator between the first and second lead frames.

In some example embodiments, the first lead frame may comprise a first mounting region. The second lead frame may comprise a plurality of second mounting regions around the first mounting region. The semiconductor chip element may be mounted on the first mounting region and the plurality of second mounting regions.

In some example embodiments, a method of manufacturing a semiconductor device package may comprise: preparing a first lead frame comprising a heat dissipation element; forming an insulator on a portion of the first lead frame; coupling a second lead frame to the first lead frame with the insulator between the first and second lead frames; forming a conductive connection element on a mounting region by the coupled first and second lead frames; and/or mounting a semiconductor chip element connected to the conductive connection element on the mounting region.

In some example embodiments, the method may be performed by using an alignment frame on which the first and second lead frames are loaded. The alignment frame may comprise a reception region for receiving the first and second lead frames and a plurality of alignment pins around the reception region.

In some example embodiments, the first lead frame may comprise a first mounting region on the heat dissipation element. The second lead frame may comprise a plurality of second mounting regions around the first mounting region.

In some example embodiments, the method may further comprise: after mounting the semiconductor chip element, forming an encapsulant covering the semiconductor chip element and portions of the first and second lead frames. At least a portion of the heat dissipation element may not be covered by the encapsulant so as to be exposed.

In some example embodiments, a method of manufacturing a semiconductor device package may comprise: preparing a first lead frame comprising a heat dissipation element and a first mounting region; preparing a second lead frame configured to be coupled to the first lead frame and comprising a second mounting region; mounting a semiconductor chip element electrically connected to the second lead frame on the second mounting region of the second lead frame; forming a resin layer on the first mounting region of the first lead frame, and forming an insulator on the first lead frame around the first mounting region; and/or coupling the second lead frame to the first lead frame with the insulator between the first and second lead frames, and mounting the semiconductor chip element on the resin layer.

In some example embodiments, the method may be performed by using an alignment frame on which the first and second lead frames are loaded. The alignment frame may comprise a reception region for receiving the first and second lead frames and a plurality of alignment pins around the reception region.

In some example embodiments, the second lead frame may comprise a plurality of second mounting regions. The plurality of second mounting regions may be spaced apart from each other around a region corresponding to the first mounting region.

In some example embodiments, the method may further comprise: after mounting the semiconductor chip element on the resin layer, forming an encapsulant covering the semiconductor chip element and portions of the first and second lead frames. At least a portion of the heat dissipation element may not be covered by the encapsulant so as to be exposed.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
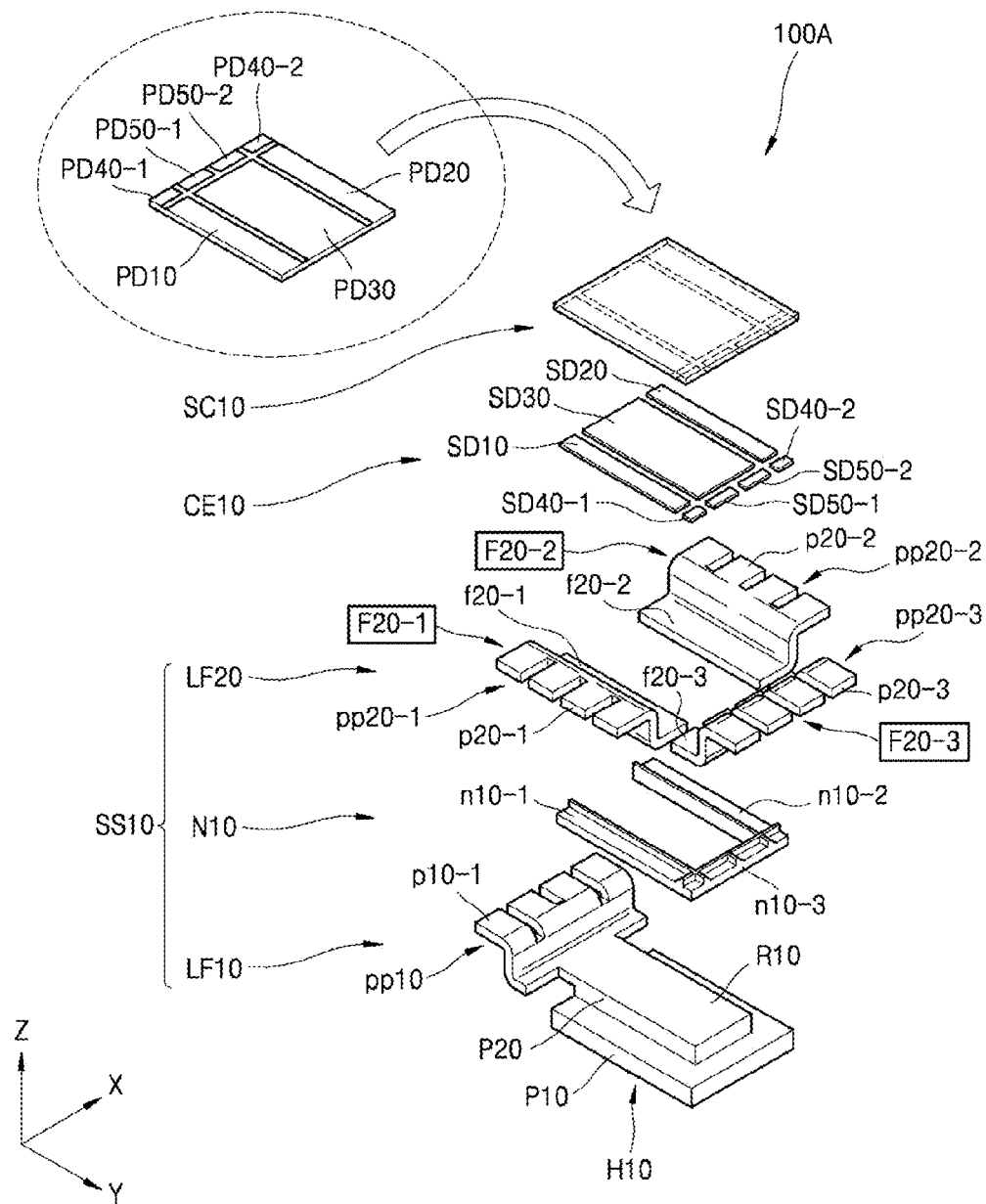
FIG. 1 is an exploded perspective view of a semiconductor device package, according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is an exploded perspective view of a semiconductor device package 100A, according to some example embodiments.

Referring to FIG. 1, the semiconductor device package 100A may include a structure in which a first lead frame LF10 and a second lead frame LF20 are coupled to each other with an insulator N10 disposed therebetween. The first lead frame LF10 and the second lead frame LF20 may be electrically separated from each other by the insulator N10. The first and second lead frames LF10 and LF20 and the insulator N10 may constitute a single supporting structure SS10. The supporting structure SS10 itself may be considered as a single "lead frame". The supporting structure SS10 may include a mounting region (that may or may not be predetermined) on which a semiconductor chip element SC10 may be mounted. The semiconductor chip element SC10 may be mounted on the mounting region in a flip-chip manner. In this regard, a conductive connection element CE10 may be provided on the mounting region. The conductive connection element CE10 may include a plurality of conductors SD10, SD20, SD30, SD40-1, SD40-2, SD50-1, and SD50-2. The plurality of conductors SD10, SD20, SD30, SD40-1, SD40-2, SD50-1, and SD50-2 may be, for example, solders in a pad form. The semiconductor chip element SC10 may be mounted on the supporting structure SS10 in a flip-chip manner through the conductive connection element CE10. Each element of the semiconductor device package 100A will be described in more detail below.

The first lead frame LF10 may include a first portion P10 and a second portion P20 provided on the first portion P10. The second portion P20 may have a width smaller than that of the first portion P10. A top surface region of the first portion P10 around the second portion P20 may be exposed. The top surface region of the first portion P10 around the second portion P20 may be exposed at both sides of the second portion P20 in an X-axis direction and at one side thereof in a Y-axis direction. In other words, the first portion P10 may extend at both sides in the X-axis direction and at one side in the Y-axis direction on a bottom surface of the second portion P20. The first portion P10 and the second portion P20 may have a plate type structure (that may or may not be predetermined). The first portion P10 and the second portion P20 may be formed of a conductor such as copper (Cu), perform a function of electrically connecting to the semiconductor chip element SC10, and simultaneously function as a "heat dissipation element". A structure of combining the first portion P10 and the second portion P20 may be referred to as a "heat dissipation element H10". A top surface of the second portion P20 may be referred to as a "mounting region (a first mounting region) R10" on which the semiconductor chip element SC10 is mounted. Alternatively, the first portion P10 may be referred to as a "heat dissipation portion (a heat dissipation element)", and the second portion P20 may be referred to as a "mounting portion (a mounting region)". In this regard, the "heat dissipation portion (the heat dissipation element)" may be referred to as a heat spreader.

The first lead frame LF10 may further include a first pin structure pp10 extending from the second portion P20. The first pin structure pp10 may include a plurality of connecting pin p10-1. The connecting pins p10-1 may be elements for connection to an external terminal (not shown). The first pin structure pp10 may extend in an opposite direction to the Y-axis direction. The number and shapes of the connecting pins p10-1 may vary.

The second lead frame LF20 may include a plurality of frame elements F20-1, F20-2, and F20-3 disposed around the second portion P20 of the first lead frame LF10. For example, the second lead frame LF20 may include the 2-1st frame element F20-1, the 2-2nd frame element F20-2, and the 2-3rd frame element F20-3. The 2-1st frame element F20-1 and the 2-2nd frame element F20-2 may be disposed to face each other with the second portion P20 of the first lead frame LF10 disposed therebetween. The 2-3rd frame element F20-3 may be disposed at one side of the 2-1st frame element F20-1 and the 2-2nd frame element F20-2. The 2-3rd frame element F20-3 may be disposed to face the first pin structure pp10 of the first lead frame LF10 with the second portion P20 disposed therebetween. The 2-1st, 2-2nd, and 2-3rd frame elements F20-1, F20-2, and F20-3 may be electrically separated from each other.

Each of the 2-1st, 2-2nd, and 2-3rd frame elements F20-1, F20-2, and F20-3 of the second lead frame LF20 may include a "mounting region (a second mounting region)" for mounting the semiconductor chip element SC10. The 2-1st frame element F20-1 may include a 2-1st mounting portion f20-1. The 2-2nd frame element F20-2 may include a 2-2nd mounting portion f20-2. The 2-3rd frame element F20-3 may include a 2-3rd mounting portion f20-3. A top surface of the 2-1st mounting portion f20-1 may be referred to as a "2-1st mounting region". A top surface of the 2-2nd mounting portion f20-2 may be referred to as a "2-2nd mounting region". A top surface of the 2-3rd mounting portion f20-3 may be referred to as a "2-3rd mounting region". The 2-1st frame element F20-1 may have a 2-1st pin structure pp20-1 extending from the 2-1st mounting portion f20-1. The 2-2nd frame element F20-2 may have a 2-2nd pin structure pp20-2 extending from the 2-2nd mounting portion f20-2. The 2-3rd frame element F20-3 may have a 2-3rd pin structure pp20-3 extending from the 2-3rd mounting portion f20-3. The 2-1st pin structure pp20-1 may include a plurality of connection pins p20-1. The 2-2nd pin structure pp20-2 may include a plurality of connection pins p20-2. The 2-3rd pin structure pp20-3 may include a plurality of connection pins p20-3. The 2-3rd mounting portion f20-3 may include a plurality of regions electrically separated from one another, and the plurality of connection pins p20-3 may be provided to correspond to the plurality of regions, respectively. Thus, the plurality of connection pins p20-3 may be electrically separated from each other. However, the structure of the second lead frame LF20 described above is an example, and may be modified in various ways.

The insulator N10 may include first through third portions n10-1, n10-2, and n10-3 respectively corresponding to the 2-1st, 2-2nd, and 2-3rd frame elements F20-1, F20-2, and F20-3. The first portion n10-1 and the second portion n10-2 of the insulator N10 may extend in the Y-axis direction, may be spaced apart from each other, and may be disposed in parallel to each other. The third portion n10-3 of the insulator N10 may connect end portions of the first portion n10-1 and the second portion n10-2. The insulator N10 may be formed of resin. The resin may include at least one material selected from the group consisting of, for example, epoxy, liquid crystal polymer (LCP), polyimide (PI), polycarbonate (PC), polyethylene terephthalate (PET), etc. These materials may be electrically non-conductive. The insulator N10 may include the resin and additive/filler (that may or may not be predetermined). The additive/filler may function to increase thermal conductivity k of the insulator N10. In this connection, the insulator N10 may have a relatively high thermal conductivity. For example, the insulator N10 may have the thermal conductivity k equal to or higher than about 5 W/(m·K) or higher than about 10 W/(m·K). The insulator N10 may be formed of a material having a coefficient of thermal expansion (CTE) similar to the first and second lead frames LF10 and LF20.

The semiconductor chip element SC10 mounted on the supporting structure SS10 may be disposed such that a surface of the semiconductor chip element SC10 on which pads PD10, PD20, PD30, PD40-1, PD40-2, PD50-1, and PD50-2 are formed faces the supporting structure SS10. The surface of the semiconductor chip element SC10 on which the pads PD10, PD20, PD30, PD40-1, PD40-2, PD50-1, and PD50-2 are formed is shown within a dotted line oval of FIG. 1. The semiconductor chip element SC10 may include the plurality of pads PD10, PD20, PD30, PD40-1, PD40-2, PD50-1, and PD50-2 for a single chip. For example, the semiconductor chip element SC10 may include the first pad PD10, the second pad PD20, and the third pad PD30 disposed between the first pad PD10 and the second pad PD20. The semiconductor chip element SC10 may include the 4-1st and 4-2nd pads PD40-1 and PD40-2 and the 5-1st and 5-2nd pads PD50-1 and PD50-2 at one side of the pads PD10, PD20, and PD30. The 5-1st and 5-2nd pads PD50-1 and PD50-2 may be provided between the 4-1st and 4-2nd pads PD40-1 and PD40-2. The first pad PD10 may be a positive voltage pad or a drain pad. The second pad PD20 may be a negative voltage pad or a source pad. The third pad PD30 may be an output pad. The 4-1st pad PD40-1 may be a first input pad or a first gate pad. The 4-2nd pad PD40-2 may be a second input pad or a second gate pad. The 5-1st and 5-2nd pads PD50-1 and PD50-2 may be respectively a first Kelvin electrode pad or a second Kelvin electrode pad. The first and second Kelvin electrode pads may be respectively first and second Kelvin source pads.

The conductive connection element CE10 may include a plurality of conductors SD10, SD20, SD30, SD40-1, SD40-2, SD50-1, and SD50-2 corresponding to a pad structure of the semiconductor chip element SC10. For example, the conductive connection element CE10 may include the first through third conductors SD10, SD20, and SD30 respectively corresponding to the first through third pads PD10, PD20, and PD30. The conductive connection element CE10 may include the 4-1st and 4-2nd conductors SD40-1 and SD40-2 respectively corresponding to the 4-1st and 4-2nd pads PD40-1 and PD40-2, and the 5-1st and 5-2nd conductors SD50-1 and SD50-2 respectively corresponding to the 5-1st and 5-2nd pads PD50-1 and PD50-2. The first and second conductors SD10 and SD20 may be respectively provided on the 2-1st mounting portion f20-1 and the 2-2nd mounting portion f20-2. The third conductor SD30 may be provided on the first mounting region R10. The 4-1st and 4-2nd conductors SD40-1 and SD40-2 and the 5-1st and 5-2nd pads PD50-1 and PD50-2 may be provided on the 2-3rd mounting portion f20-3. The plurality of conductors SD10, SD20, SD30, SD40-1, SD40-2, SD50-1, and SD50-2 may be, for example, solders in a pad shape. Thus, the plurality of conductors SD10, SD20, SD30, SD40-1, SD40-2, SD50-1, and SD50-2 may be solder pads. However, materials and shapes of the plurality of conductors SD10, SD20, SD30, SD40-1, SD40-2, SD50-1, and SD50-2 may be modified in various ways.

The pad structure of the semiconductor chip element SC10 and the structure of the conductive connection element CE10 described above may be modified in various ways. The pad number and structure of the semiconductor chip element SC10 and the number and structures of the plurality of conductors SD10, SD20, SD30, SD40-1, SD40-2, SD50-1, and SD50-2 may be modified in various ways. For example, positions and functions of the first through third pads PD10, PD20, and PD30 and positions and functions of the 4-1st, 4-2nd, 5-1st, and 5-2nd pads PD40-1, PD40-2, PD50-1, and PD50-2 may vary. The 5-1st and 5-2nd pads PD50-1 and PD50-2 may not be provided. The structure of the conductive connection element CE10 may be different according to a change in the pad structure.

The semiconductor chip element SC10 according to some example embodiments may be configured as a single chip. The single chip may have a structure in which a plurality of devices (switches) are monolithically integrated on a single substrate. For specific example, the semiconductor chip element SC10 may include a Group III-V based device unit provided on a single crystalline substrate, for example, a silicon substrate. The Group III-V based device unit may be a gallium nitride (GaN) based device unit, for example. The semiconductor chip element SC10 may include a plurality of transistors (FETs) based on a Group III-V material. The plurality of transistors may constitute a plurality (for example, two) of switching units. In this regard, the switching units may be connected to each other. The switching units may have a half-bridge connection structure. In this case, the semiconductor chip element SC10 may have a monolithic half-bridge device structure. The configuration of the semiconductor chip element SC10 may be the same as or similar to that disclosed in Korean Patent Application No. 10-2013-0149497.

In particular, when the semiconductor chip element SC10 includes a gallium nitride (GaN) based device unit provided on a silicon substrate, the semiconductor chip element SC10 may include a "GaN-on-Si device". The "GaN-on-Si device" has an advantage in terms of cost reduction, thereby greatly contributing to expansion of use of the GaN based device. Also, a device using a GaN based semiconductor may greatly increase efficiency of a system because of a low switching loss due to a low conduction loss and a fast switching characteristic, may enable a volume reduction of a passive component due to a high operating frequency, and may have low temperature dependence according to a wide bandgap characteristic. Thus, if a power device (or a power system) is configured by using the GaN based semiconductor, performance of the power device (or the power system) may be greatly improved. The semiconductor chip element SC10 may be the power device (or the power system) or may be an element of the power device (or the power system).

The structure of the semiconductor device package 100A of FIG. 1 for packaging the semiconductor chip element SC10 may have various advantages in terms of improvement of a heat dissipation characteristic, improvement of operating speed, securing of a high power handling characteristic, securing of a withstand voltage characteristic, convenience of manufacturing, high throughput, small package size, etc.

These will be described in more detail later.

Figure 2:
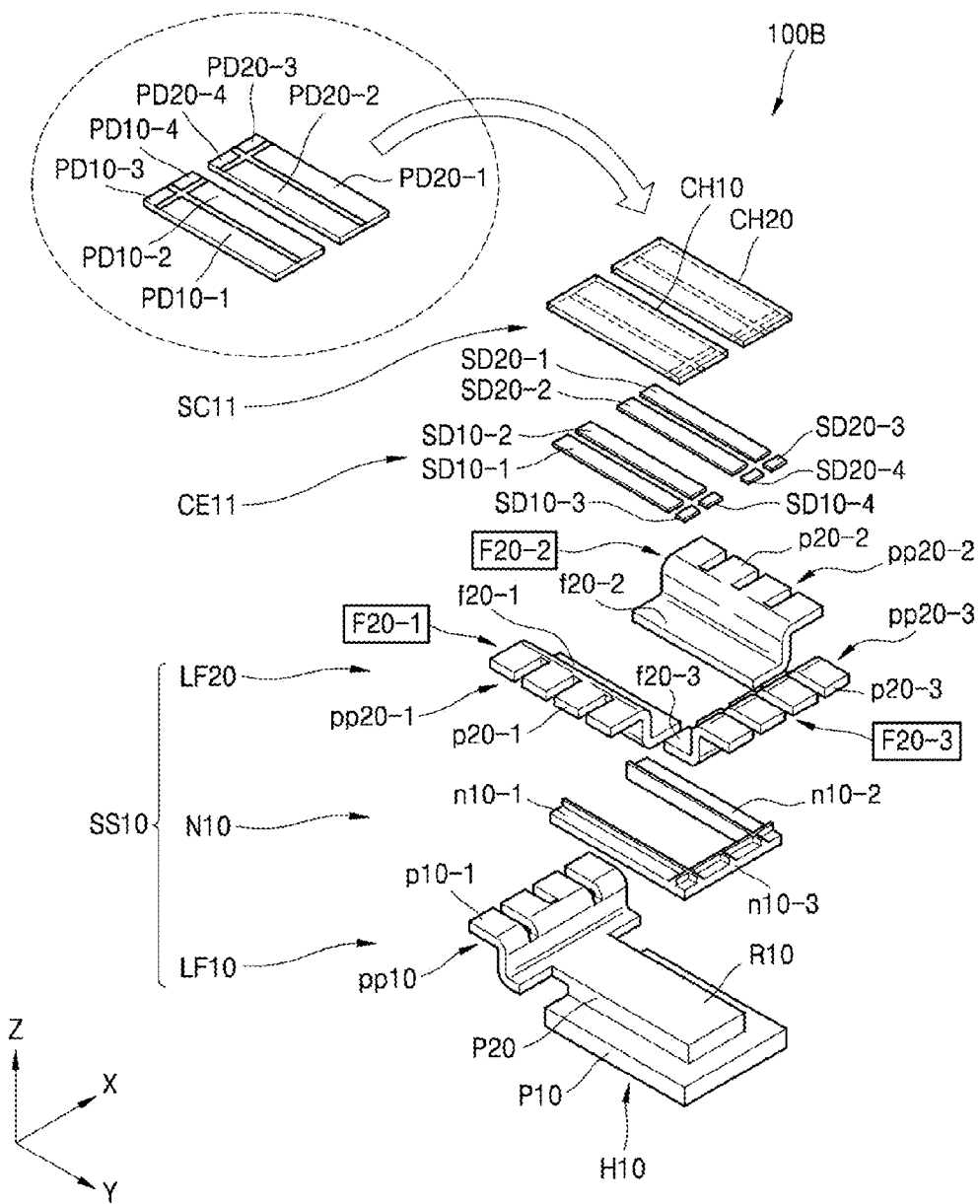
FIG. 2 is an exploded perspective view of a semiconductor device package, according to some example embodiments.

FIG. 2 is an exploded perspective view of a semiconductor device package 100B, according to some example embodiments. A semiconductor chip element SC11 according to some example embodiments may include a plurality of chips CH10 and CH20. That is, the plurality of chips CH10 and CH20 are simultaneously packaged according to some example embodiments.

Referring to FIG. 2, the semiconductor chip element SC11 may include the first chip CH10 and the second chip CH20 that are separated from each other. The first chip CH10 may include a first drain pad PD10-1, a first source pad PD10-2, and a first gate pad PD10-3. The first chip CH10 may further include a first Kelvin electrode pad PD10-4. The first Kelvin electrode pad PD10-4 may be a first Kelvin source pad. The second chip CH20 may include a second drain pad PD20-1, a second source pad PD20-2, and a second gate pad PD20-3. The second chip CH20 may further include a second Kelvin electrode pad PD20-4. The second Kelvin electrode pad PD20-4 may be a second Kelvin source pad. The first and second Kelvin electrode pads PD10-4 and PD20-4 may not be provided. In addition, the configurations of the first chip CH10 and the second chip CH20 may be modified in various ways. The semiconductor chip element SC11 may include three or more chips.

A conductive connection element CE11 may include a plurality of conductors SD10-1, SD10-2, SD10-3, SD10-4, SD20-1, SD20-2, SD20-3, and SD20-4 corresponding to a pad structure of the first chip CH10 and the second chip CH20. For example, the conductive connection element CE11 may include the 1-1st, 1-2nd, and 1-3rd conductors SD10-1, SD10-2, and SD10-3 respectively corresponding to the first drain pad PD10-1, the first source pad PD10-2, and the first gate pad PD10-3. The conductive connection element CE11 may further include the 1-4th conductor SD10-4 corresponding to the first Kelvin electrode pad PD10-4. The conductive connection element CE11 may include the 2-1st, 2-2nd, and 2-3rd conductors SD20-1, SD20-2, and SD20-3 respectively corresponding to the second drain pad PD20-1, the second source pad PD20-2, and the second gate pad PD20-3. The conductive connection element CE11 may further include the 2-4th conductor SD20-4 corresponding to the second Kelvin electrode pad PD20-4. The structure of the conductive connection element CE11 may be modified in various ways according to a change in the pad structure of the first chip CH10 and the second chip CH20.

The 1-1st conductor SD10-1 may be provided on the 2-1st mounting portion f20-1. The 2-1st conductor SD20-1 may be provided on the 2-2nd mounting portion f20-2. The 1-2nd conductor SD10-2 may be provided on a first region of the first mounting region R10. The 2-2nd conductor SD20-2 may be provided on a second region of the first mounting region R10. Thus, the 1-2nd conductor SD10-2 and the 2-2nd conductor SD20-2 may be commonly connected to the first lead frame LF10. The 1-3rd, 1-4th, 2-3rd, and 2-4th conductors SD10-3, SD10-4, SD20-3, and SD20-4 may be provided on different regions of the 2-3rd mounting portion f20-3.

The first lead frame LF10, the second lead frame LF20, and the insulator N10 of FIG. 2 may have the same structures as those of the first lead frame LF10, the second lead frame LF20, and the insulator N10 of FIG. 1. Thus, redundant descriptions thereof are excluded.

Figure 3:
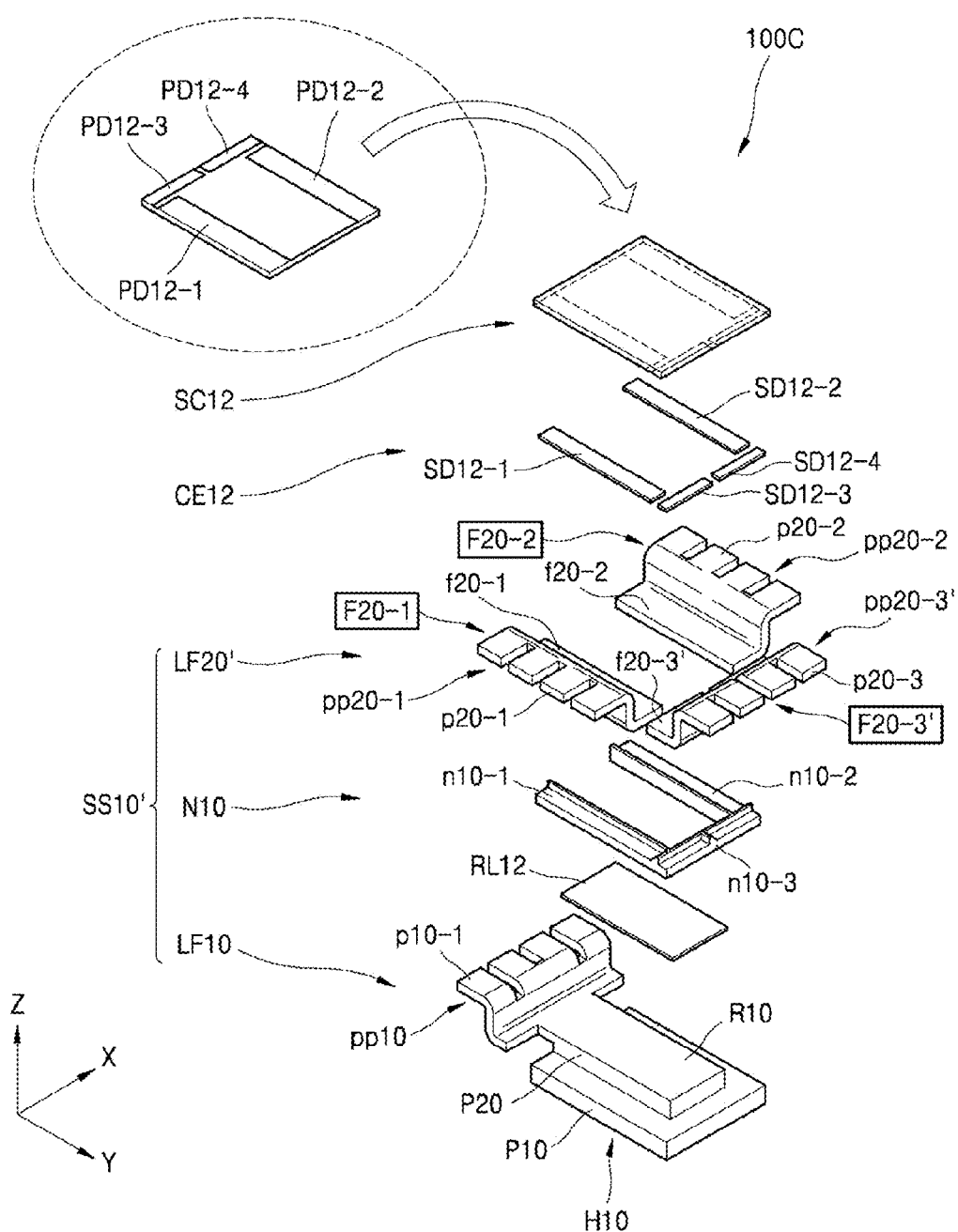
FIG. 3 is an exploded perspective view of a semiconductor device package, according to some example embodiments.

FIG. 3 is an exploded perspective view of a semiconductor device package 100C, according to some example embodiments. A semiconductor chip element SC12 according to some example embodiments may have a different configuration from that of the semiconductor chip elements SC10 and SC11 of FIGS. 1 and 2. A pad side surface of the semiconductor chip element SC12 is shown in a dotted line oval of FIG. 3. The first lead frame LF10 according to some example embodiments may act as a mounting region and a heat dissipation element. However, the first lead frame LF10 may not perform an electrical connection function with respect to the semiconductor chip element SC12.

Referring to FIG. 3, the semiconductor chip element SC12 may include a drain pad PD12-1, a source pad PD12-2, and a gate pad PD12-3, and may further include a Kelvin electrode pad PD12-4. The drain pad PD12-1 and the source pad PD12-2 may be spaced apart from each other by a gap (that may or may not be predetermined). A region between the drain pad PD12-1 and the source pad PD12-2 may correspond to the first mounting region R10 of the first lead frame LF10. The Kelvin electrode pad PD12-4 may not be provided. In addition, the configuration of the semiconductor chip element SC12 may be modified in various ways.

A conductive connection element CE12 may include a plurality of conductors SD12-1, SD12-2, SD12-3, and SD12-4 corresponding to a pad structure of the semiconductor chip element SC12. For example, the conductive connection element CE12 may include the first, second, and third conductors SD12-1, SD12-2, and SD12-3 respectively corresponding to the drain pad PD12-1, the source pad PD12-2, and the gate pad PD12-3. The conductive connection element CE12 may further include the fourth conductor SD12-4 corresponding to the Kelvin electrode pad PD12-4. The structure of the conductive connection element CE12 may be modified in various ways according to a change in the pad structure of the semiconductor chip element SC12.

The first conductor SD12-1 may be provided on the 2-1st mounting portion f20-1. The second conductor SD12-2 may be provided on the 2-2nd mounting portion f20-2. The third and fourth conductors SD12-3 and SD12-4 may be provided on different regions of a 2-3rd mounting portion f20-3'. In this regard, the 2-3rd mounting portion f20-3' may have a slightly modified structure from that of the 2-3rd mounting portion f20-3 of FIG. 1. That is, the 2-3rd mounting portion f20-3' may be split into two mounting portions corresponding to the third and fourth conductors SD12-3 and SD12-4. A 2-3rd pin structure pp20-3' may be similar to the 2-3rd pin structure pp20-3 of FIG. 1, however, in some cases, the 2-3rd pin structure pp20-3' may have a slightly modified structure from that of the 2-3rd pin structure pp20-3. The 2-3rd mounting portion f20-3' and the 2-3rd pin structure pp20-3' may have the same structures as those of the 2-3rd mounting portion f20-3 and the 2-3rd pin structure pp20-3 of FIG. 1. F20-3' denotes a 2-3rd frame element. LF20' denotes a second lead frame. SS10' denotes a supporting structure. The second lead frame LF20' may have a slightly modified structure from that of the second lead frame LF20 of FIG. 1 or may have the same structure as the second lead frame LF20 of FIG. 1.

A resin layer RL12 may be provided on the first mounting region R10 of the first lead frame LF10. The semiconductor chip element SC12 may be mounted on the resin layer RL12. That is, a region between the drain pad PD12-1 and the source pad PD12-2 of the semiconductor chip element SC12 may be mounted on the resin layer RL12. The resin layer RL12 may be an electrical insulator. The resin layer RL12 may include at least one material selected from the group consisting of epoxy, liquid crystal polymer (LCP), polyimide (PI), polycarbonate (PC), polyethylene terephthalate (PET), etc. The resin layer RL12 may include additive/filler (that may or may not be predetermined) in addition to resin.

The additive/filler may include, for example, boron nitride (BN), $Al_2O_3$, carbon nanotube (CNT), etc. The additive/filler may function to increase thermal conductivity of the resin layer RL12. In this connection, the resin layer RL12 may have a relatively high thermal conductivity. For example, the resin layer RL12 may have a thermal conductivity k equal to or higher than about 1 W/(m·K) or about 5 W/(m·K). The thermal conductivity k of the resin layer RL12 may be higher than about 10 W/(m·K). The resin layer RL12 may be formed of a material having a coefficient of thermal expansion (CTE) similar to the first and second lead frames LF10 and LF20'.

According to some example embodiments, there is little or no restriction to the material (resin and filler) used as the resin layer RL12, and thus the high thermal conductivity of the resin layer RL12 may be easily obtained. In a conventional package structure, since resin is filled under a chip through underfilling, there are many restrictions with respect to available materials, and a filling defect may easily occur. In this connection, the thermal conductivity of an underfill resin layer may not be easily obtained, a failure rate may increase, and package performance may deteriorate. However, since underfilling may not be used in some example embodiments, there is no restriction as to the material (resin and filler) used as the resin layer RL12, and thus the high thermal conductivity of the resin layer RL12 may be easily obtained. Also, filling defects may be prevented.

Figure 4:
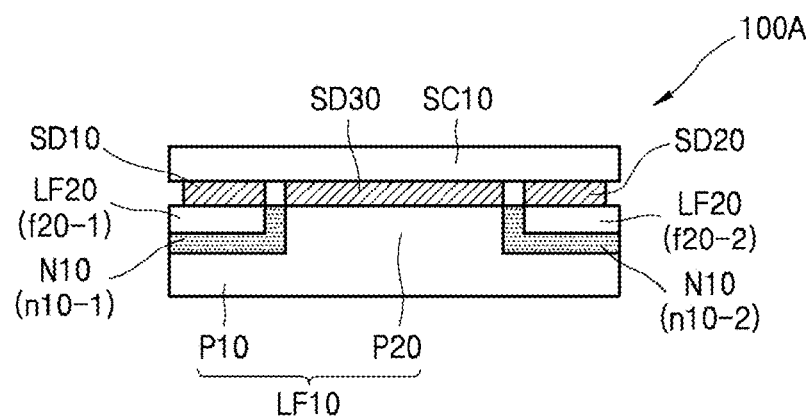
FIGS. 4 through 6 are cross-sectional views of semiconductor device packages, according to some example embodiments.
Figure 5:
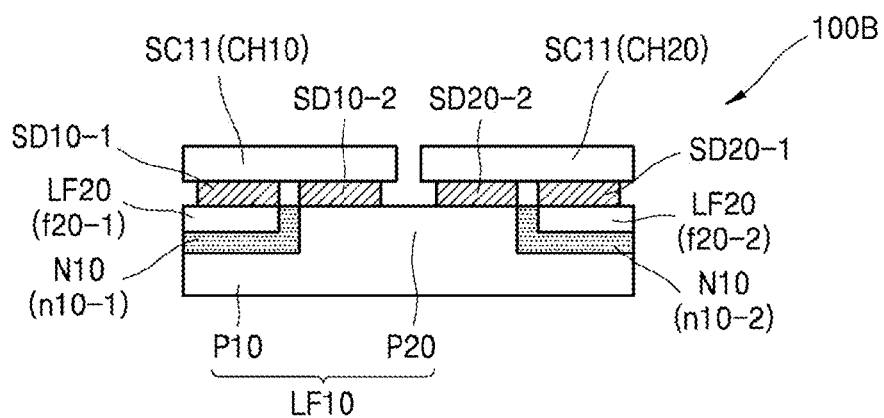
Figure 6:
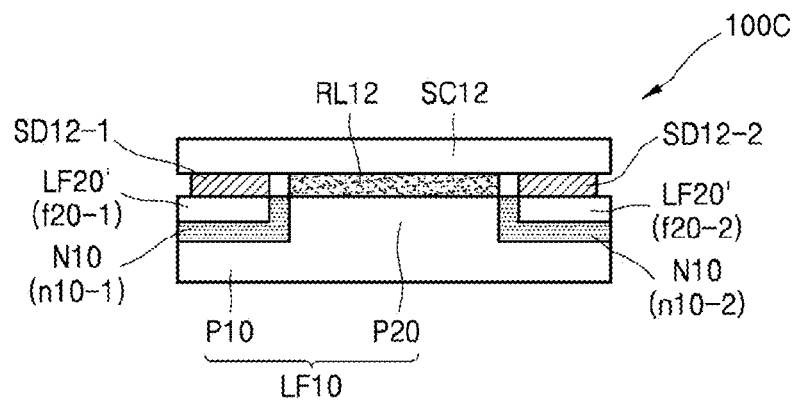

FIGS. 4 through 6 are cross-sectional views of the semiconductor device packages 100A, 100B, and 100C, according to some example embodiments. FIGS. 4 through 6 are respectively cross-sectional views of the semiconductor device packages 100A, 100B, and 100C of FIGS. 1 through 3 in an X-axis direction.

Referring to FIGS. 4 through 6, cross-sectional structures of the semiconductor device packages 100A, 100B, and 100C may correspond to structures of the semiconductor device packages 100A, 100B, and 100C of FIGS. 1 through 3. In this regard, the first mounting region R10 of the first lead frame LF10 and the mounting units (second mounting regions) f20-1 and f20-2 of the second lead frames LF20 and LF20' may be provided at the same level (or a similar level) to form a single plane (mounting region). That is, the first lead frame LF10 and the second lead frames LF20 and LF20' may form a single mounting region provided at the same level (on the same plane). The semiconductor chip elements SC10, SC11, and SC12 may be provided on the mounting region. The semiconductor chip elements SC10, SC11, and SC12 may be provided at one side with respect to the first lead frame LF10 and the second lead frames LF20 and LF20'. A part of the first lead frames LF10 may overlap with a part of the second lead frame LF20 or LF20'. Also, a part of the second lead frame LF20 or LF20' may be disposed between the first lead frame LF10 and the semiconductor chip element SC10, SC11, or SC12. However, the cross-sectional structures of FIGS. 4 through 6 are examples, and may be modified in various ways as necessary.

Figure 7:
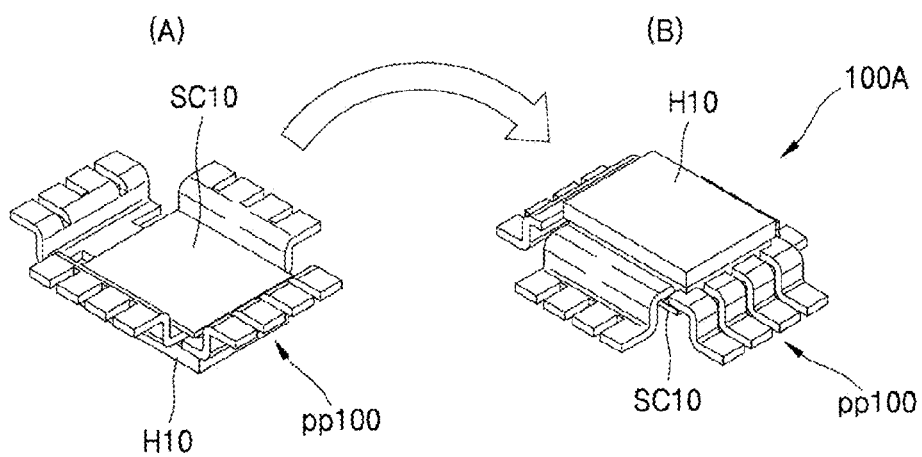
FIG. 7 is a perspective view of a combined structure of a semiconductor device package, according to some example embodiments.

FIG. 7 is a perspective view of a combined structure of the semiconductor device package 100A, according to some example embodiments. A structure (A) of FIG. 7 is a combined structure of the semiconductor device package 100A of FIG. 1. A structure (B) of FIG. 7 is an upside down structure of the structure (A). Pin structures pp100 that are in four directions of the semiconductor chip element SC10 may be bent toward the semiconductor chip element SC10 with respect to the heat dissipation element H10.

Figure 8:
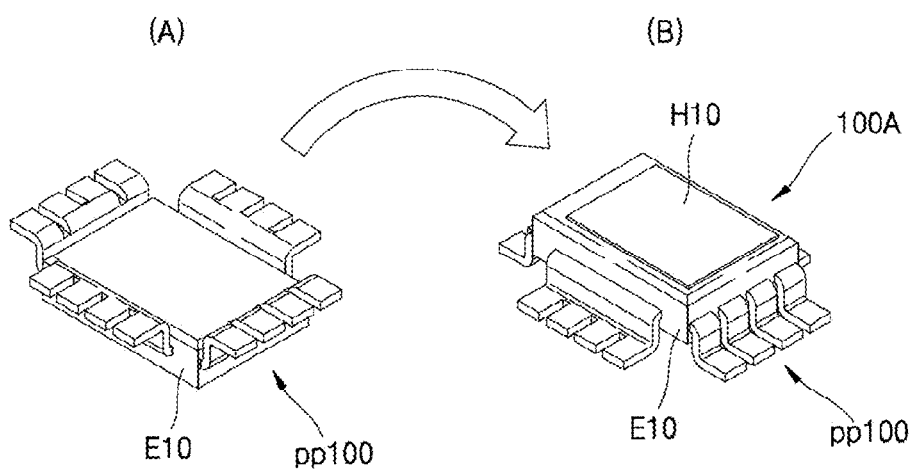
FIG. 8 is a perspective view of a package structure in which an encapsulant for protecting a semiconductor chip element is provided to the semiconductor device package of FIG. 7.

FIG. 8 is a perspective view of a package structure in which an encapsulant E10 for protecting the semiconductor chip element SC10 is provided to the semiconductor device package 100A of FIG. 7. A structure (B) of FIG. 8 is an upside down structure of a structure (A). The encapsulant E10 may be an epoxy molding compound (EMC). The encapsulant E10 may be formed to surround the semiconductor chip element (SC10 of FIG. 7) and cover a portion of the supporting structure (SS10 of FIG. 1). At least a part of the heat dissipation element H10, for example, a top surface portion (of the structure B), may be exposed by not being covered by the encapsulant E10. The pin structures pp100 that are in four directions of the semiconductor chip element (SC10 of FIG. 7) may also be exposed by not being covered by the encapsulant E10. Since a part of the heat dissipation element H10 is exposed, an external heat sink (not shown) contacting the exposed surface of the heat dissipation element H10 may be additionally provided. In this case, heat dissipation performance may be further enhanced.

In a state/direction of the structure (B), i.e., in a state/direction in which the heat dissipation element H10 is disposed on the semiconductor chip element SC10, the semiconductor device package 100A may be mounted on a printed circuit board (PCB) (not shown) (that may or may not be predetermined). Thus, the PCB may be provided below the structure (B).

Figure 9:
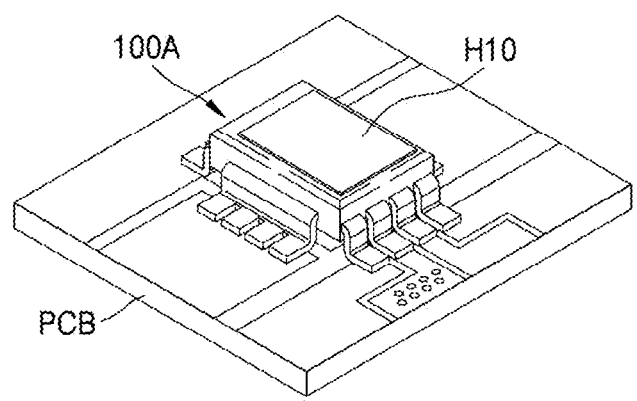
FIG. 9 is a perspective view of the semiconductor device package of FIG. 8 mounted on a printed circuit board (PCB)

FIG. 9 is a perspective view of the structure (B) of FIG. 8 mounted on a printed circuit board (PCB).

Figure 10:
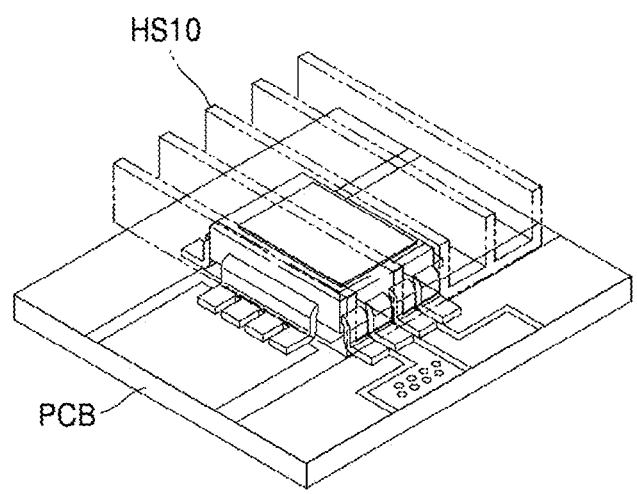
FIG. 10 is a perspective view of a package structure in which an external heat sink is provided on the semiconductor device package of FIG. 9.

FIG. 10 is a perspective view of a package structure in which an external heat sink HS10 is provided on the semiconductor device package 100A of FIG. 9. The external heat sink HS10 may contact the heat dissipation element H10. A structure of the external heat sink HS10 is an example, and may be modified in various ways.

Figure 11:
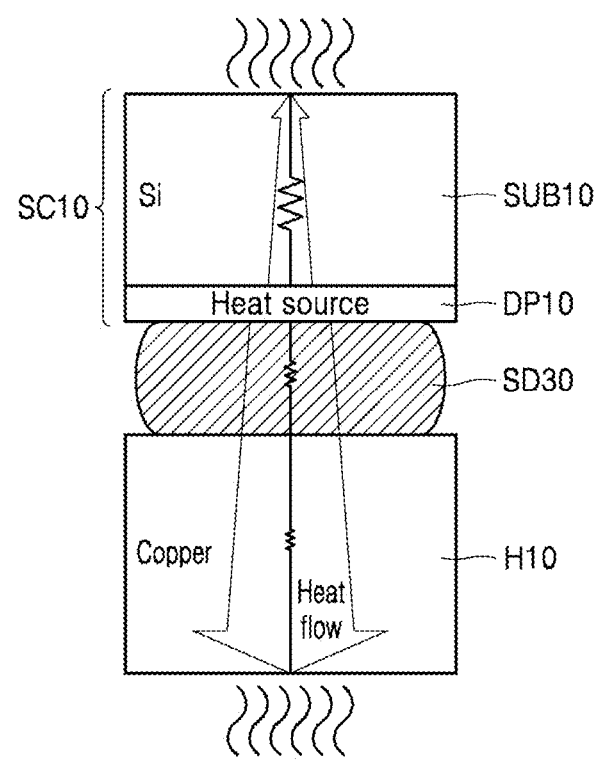
FIG. 11 is a cross-sectional view of a part of a semiconductor device package, according to some example embodiments.

FIG. 11 is a cross-sectional view of a part of the semiconductor device package 100A of FIG. 1, according to some example embodiments. FIG. 11 is a cross-sectional view of a center portion of the semiconductor device package 100A of FIG. 1. In this regard, the semiconductor chip element SC10 may include a Group III-V based device unit DP10 provided on a silicon substrate SUB10.

Referring to FIG. 11, the semiconductor chip element SC10 may include the Group III-V based device unit DP10 provided on the silicon substrate SUB10. The Group III-V based device unit DP10 may be a GaN based device unit. Thus, the semiconductor chip element SC10 may include a "GaN-on-Si device". A supporting structure may include the heat dissipation element H10 and the conductor SD30 provided on the heat dissipation element H10. The conductor SD30 may be disposed between the heat dissipation element H10 and the Group III-V based device unit DP10. The Group III-V based device unit DP10 may be disposed between the conductor SD30 and the silicon substrate SUB10. When the Group III-V based device unit DP10 operates, heat may be generated from the Group III-V based device unit DP10. Thus, the Group III-V based device unit DP10 may be a heat source.

The semiconductor device package having a cross-sectional structure of FIG. 11 may have an excellent heat dissipation characteristic. More specifically, according to some example embodiments, a flip-chip manner may be used to reduce a distance between the heat source (i.e., the Group III-V based device unit DP10) and the heat dissipation element H10, and the conductor SD30 that is an electrically conductive material and has an excellent thermal transfer characteristic is disposed between the heat source and the heat dissipation element H10, and thus the excellent heat dissipation characteristic (i.e., a low heat resistance characteristic) may be obtained. Thus, heat generated from the heat source (i.e., the Group III-V based device unit DP10) may be easily dissipated. The semiconductor device package having a cross-sectional structure as shown in FIG. 11 may also obtain an effect of electrically floating the silicon substrate SUB10. In this regard, a withstand voltage characteristic of the semiconductor chip element SC10 may be improved to increase a breakdown voltage, and may obtain a high power handling characteristic.

The semiconductor device packages according to some example embodiments described with reference to FIGS. 1 through 11 may have a structure advantageous to satisfying diverse requirement conditions required in a package technology, for example, single side interconnection, small electrical parasitic inductance, high breakdown voltage, low thermal resistance, high power handling, high throughput, small size (i.e., small footprint), etc. More specifically, the first lead frame LF10 and the second lead frames LF20 and LF20' are coupled to each other with the insulator N10 disposed therebetween, the first lead frame LF10 may perform heat dissipation and electrical connection functions, and the second lead frames LF20 and LF20' may perform the electrical connection function. The first lead frame LF10 and the second lead frames LF20 and LF20' may provide a plurality of electrically separated mounting regions. The semiconductor chip elements SC10, SC11, and SC12 may be mounted on the supporting structures SS10 and SS10' obtained by coupling the first lead frame LF10 and the second lead frames LF20 and LF20' by using a flip-chip manner. In this regard, a substrate (for example, a silicon substrate) of the semiconductor chip elements SC10, SC11, and SC12 may be electrically floated. In such a package structure, wire bonding is not used but an electrical connection using a flip-chip manner is used, and two coupled lead frames are used, thereby greatly reducing parasitic components. In this connection, an operating (switching) speed and efficiency of a device may be improved, and a load on a cooling system may be reduced due to heating reduction. Also, the first lead frame LF10 includes the heating dissipation element H10 by which heat may be easily transferred/dissipated, thereby improving the heat dissipation performance and facilitating the high current driving. In particular, the Group III-V based device unit DP10 of FIG. 11 of the semiconductor chip elements SC10, SC11, and SC12 is closer to the heat dissipation element H10 with the conductor SD30 therebetween, and thus heat generated from the Group III-V based device unit DP10 of FIG. 11 may be easily dissipated through the heat dissipation element H10. In addition, an external heat sink contacting the heat dissipation element H10 may be easily installed, and thus the heat dissipation performance may be further improved. The substrate (for example, the silicon substrate) of the semiconductor chip elements SC10, SC11, and SC12 may be electrically floated, thereby improving a withstand voltage characteristic, a breakdown voltage, and a high power handling characteristic. The semiconductor device package according to some example embodiments may be easily manufactured by slightly changing an existing production process, and may be mounted in a pick-and-place manner, and thus is advantageous in terms of enhancement of throughput. Also, the semiconductor device package according to some example embodiments is a surface mountable type, and thus has a relatively small size (small footprint).

As described above, the semiconductor device package according to some example embodiments may be implemented to satisfy high power driving, high speed operation, and high efficiency characteristics. The semiconductor device package according to some example embodiments may be implemented to have an excellent heat dissipation characteristic, have small electrical parasitic components, and be advantageous in terms of enhancement of the withstand voltage characteristic. In particular, the semiconductor device package according to some example embodiments may be implemented to be suitable for a device that applies a Group III-V based material (for example, a GaN based material) onto a single crystal substrate (for example, the silicon substrate). That is, the semiconductor device package according to some example embodiments may be implemented to be suitable for a characteristic of a III-V based device, in particular, the "GaN-on-Si device".

Figure 12:
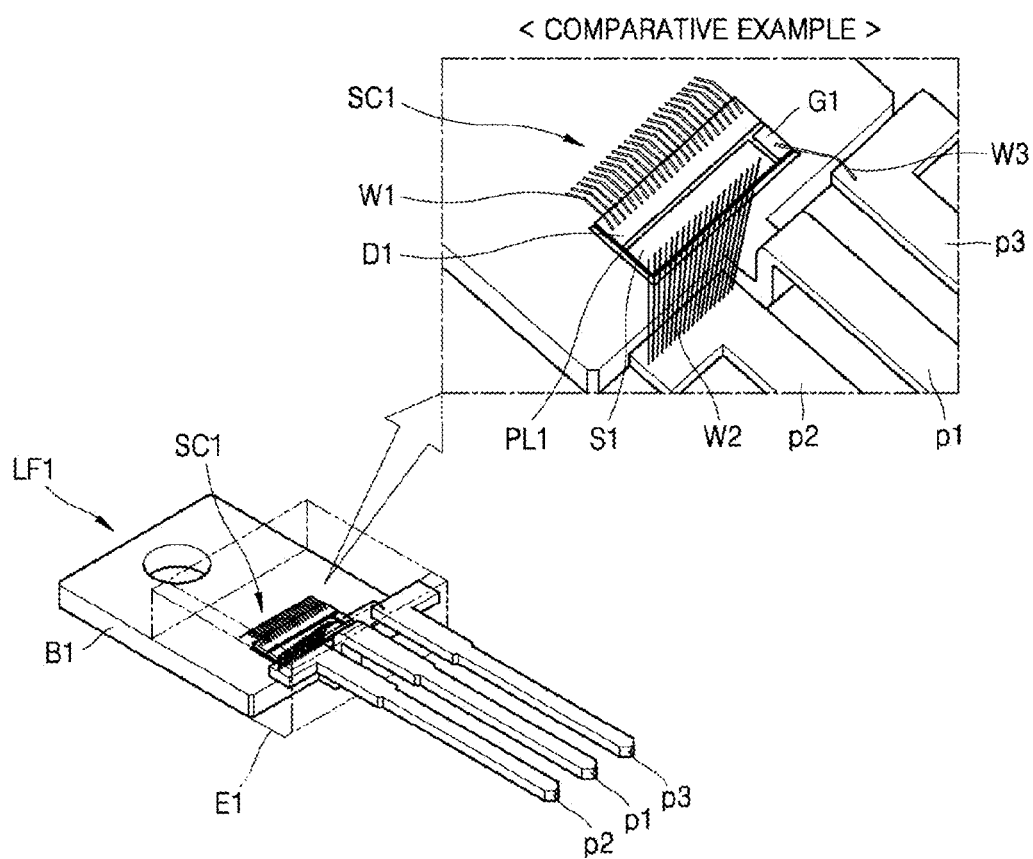
FIG. 12 is a perspective view of a semiconductor device package, according to a comparative example.

FIG. 12 is a perspective view of a semiconductor device package, according to a comparative example. The semiconductor device package according to the comparative example has a transistor outline (TO) package structure.

Referring to FIG. 12, a lead frame LF1 including a mounting unit (a main body unit) B1 and three pins p1, p2, and p3 is prepared. The first pin p1 in the middle of the three pins p1, p2, and p3 is integrally formed with the mounting unit B1. The second and third pins p2 and p3 at both sides of the first pin p1 are separated from the mounting unit B1. A semiconductor chip SC1 is mounted on the mounting unit B1 of the lead frame LF1. The semiconductor chip SC1 includes a source pad S1, a drain pad D1, and a gate pad G1 on its top surface. The semiconductor chip SC1 and the lead frame LF1 are connected via bonding wires W1, W2, and W3. The drain pad D1 is connected to the mounting unit B1. The source pad S1 is connected to the second pin p2. The gate pad G1 is connected to the third pin p3. The drain pad D1 is connected to the first pin p1 through the mounting unit B1. An electrically non-conductive polymer layer PL1 is provided between the semiconductor chip SC1 and the mounting unit B1. The electrically non-conductive polymer layer PL1 acts to electrically separate the semiconductor chip SC1 and the mounting unit B1. A reference numeral E1 denotes an epoxy molding compound (EMC) element for protecting the semiconductor chip SC1.

Figure 13:
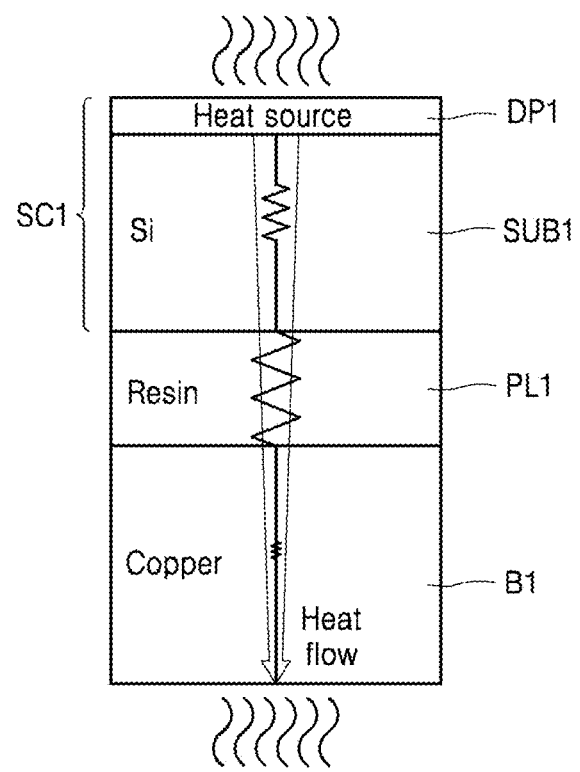
FIG. 13 is a cross-sectional view of a part of the semiconductor device package of FIG. 12.

FIG. 13 is a cross-sectional view of a part of the semiconductor device package of FIG. 12. The semiconductor device package of FIG. 13 includes the semiconductor chip SC1 in which a Group III-V based device unit DP1 is provided on a silicon substrate SUB1. The semiconductor device package of FIG. 13 according to a comparative example may be compared to the semiconductor device package of FIG. 11 according to some example embodiments.

Referring to FIG. 13, the electrically non-conductive polymer layer PL1 is provided on the mounting unit B1, and the semiconductor chip SC1 is mounted thereon. The semiconductor chip SC1 includes the silicon substrate SUB1 provided on the electrically non-conductive polymer layer PL1 and the Group III-V based device unit DP1 provided on the silicon substrate SUB1. The electrically non-conductive polymer layer PL1 is provided between the mounting unit B1 and the silicon substrate SUB1. The silicon substrate SUB1 is provided between the electrically non-conductive polymer layer PL1 and the Group III-V based device unit DP1.

In the semiconductor device package of FIG. 13, heat may not smoothly flow and may not be transferred due to a high heat resistance of the electrically non-conductive polymer layer PL1 (a resin layer). That is, heat generated from the Group III-V based device unit DP1 that is a heat source flows into the mounting unit B1 through the silicon substrate SUB1 and the electrically non-conductive polymer layer PL1. In this regard, the electrically non-conductive polymer layer PL1 has a high heat resistance, which causes deterioration of heat dissipation performance. In other words, the heat dissipation performance of the semiconductor device package deteriorates due to the electrically non-conductive polymer layer PL1 used to electrically float the silicon substrate SUB1.

Figure 14:
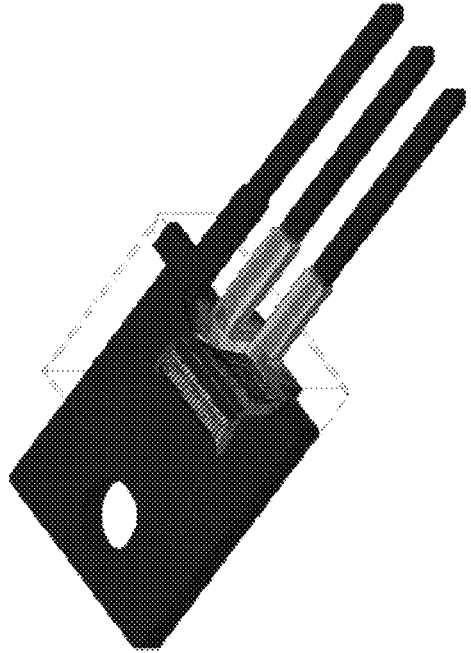
FIGS. 14 and 15 show simulation results obtained by measuring parasitic components of semiconductor device packages according to a comparative example and some example embodiments.
Figure 15:
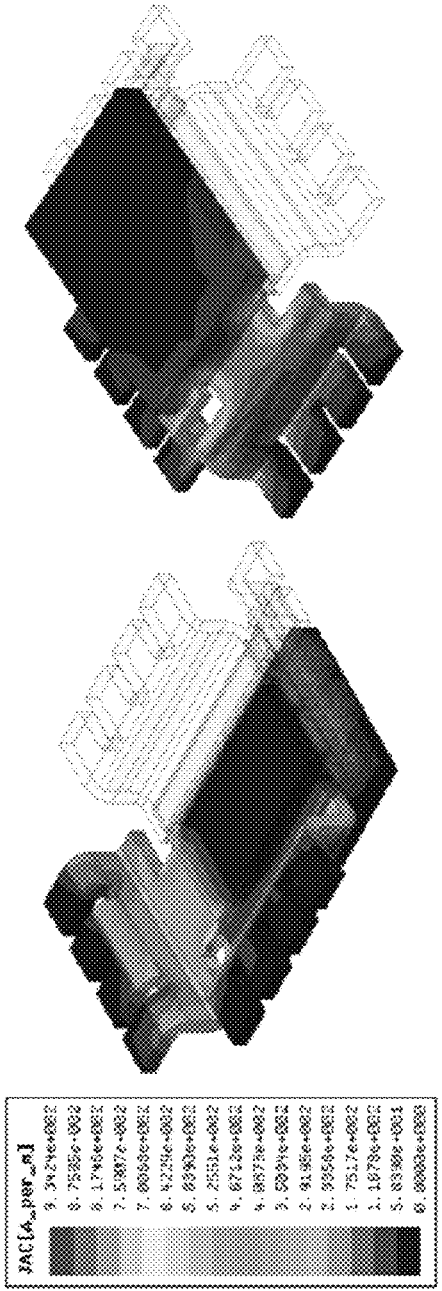

FIGS. 14 and 15 show simulation results obtained by measuring parasitic components of semiconductor device packages according to a comparative example and some example embodiments. A boundary element method (BEM) simulation is used to measure a matrix of parasitic components (inductance and resistance). "AC L" denotes alternating current inductance at 1 megahertz (MHz) in nanohenries (nH). "AC R" denotes alternating current resistance at 1 MHz in milliohms (mΩ) or microohms (μΩ). $L_{d1}$ and $L_{s1}$ respectively denote drain inductance and source inductance in nH. $L_M$ denotes mutual inductance of drain/source in nH. $R_{d1}$ and $R_{s1}$ respectively denote drain resistance and source resistance in mΩ or μΩ. $R_M$ denotes mutual resistance of drain/source in mΩ or μΩ.

Upon comparing FIGS. 14 and 15, the source inductance $L_{s1}$ that directly influences efficiency of a system is about 1/10 smaller in the semiconductor device package according to some example embodiments than in a semiconductor device package according to a comparative example. Thus, the semiconductor device package according to some example embodiments may greatly enhance the efficiency of the system.

FIGS. 16A, 16B, 17A, 17B, 18A, 18B, 19A, 19B, 20A, 20B, 21A, 21B, 22A, 22B, 23A, 23B, 24A, and 24B are perspective views for explaining a method of manufacturing a semiconductor device package, according to some example embodiments. FIGS. 16A, 17A, 18A, 19A, 20A, 21A, 22A, 23A, and 24A are perspective views from above the semiconductor device package. FIGS. 16B, 17B, 18B, 19B, 20B, 21B, 22B, 23B, and 24B are perspective views from below the semiconductor device package.

Figure 16A:
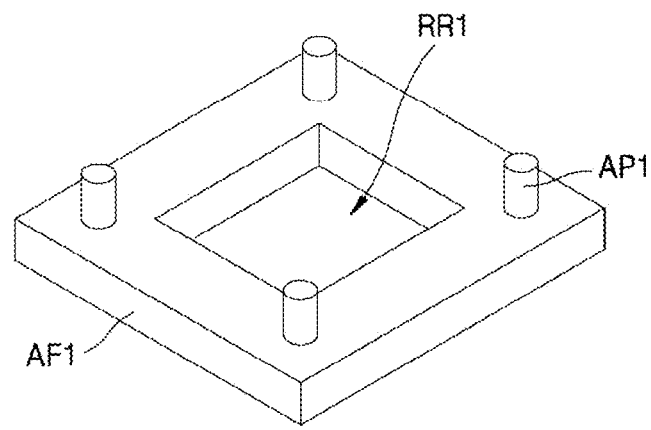
FIGS. 16A, 16B, 17A, 17B, 18A, 18B, 19A, 19B, 20A, 20B, 21A, 21B, 22A, 22B, 23A, 23B, 24A, and 24B are perspective views for explaining a method of manufacturing a semiconductor device package, according to some example embodiments.
Figure 16B:
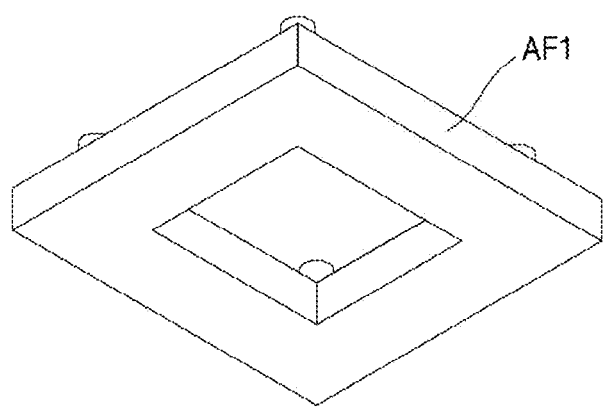

Referring to FIGS. 16A and 16B, an alignment frame AF1 (that may or may not be predetermined) may be prepared. The alignment frame AF1 may include a reception region RR1 (that may or may not be predetermined) and a plurality of alignment pins AP1 provided around the reception region RR1. The reception region RR1 may be an opening region as shown but may not be the opening region. At least two alignment pins AP1 may be provided around the reception region RR1. Four alignment pins AP1 may be used according to some example embodiments. Shapes of the alignment pins AP1 may be modified in various ways. The alignment frame AF1 may be referred to as a boat including the alignment pins AP1.

Figure 17A:
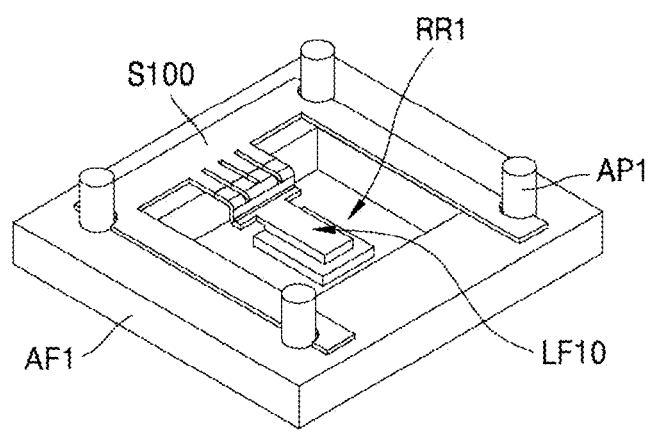
Figure 17B:
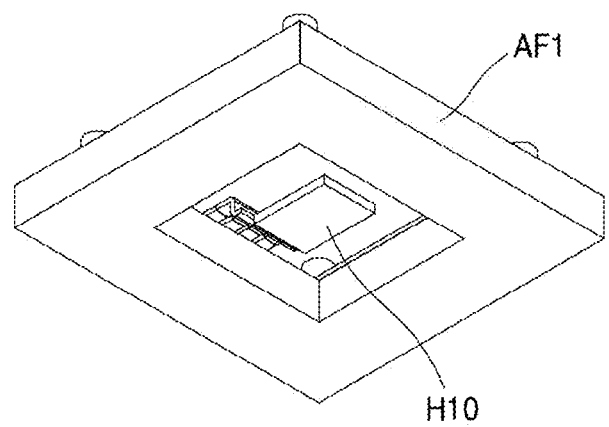

Referring to FIGS. 17A and 17B, a first structure S100 including a first lead frame LF10 may be loaded onto the alignment frame AF1. The first lead frame LF10 may have a structure that is the same as or similar to that of the first lead frame LF10 described with reference to FIGS. 1 through 3. The first lead frame LF10 may be located in the reception region RR1, and a peripheral portion of the first structure S100 may be inserted into at least a part of the alignment pins AP1.

Figure 18A:
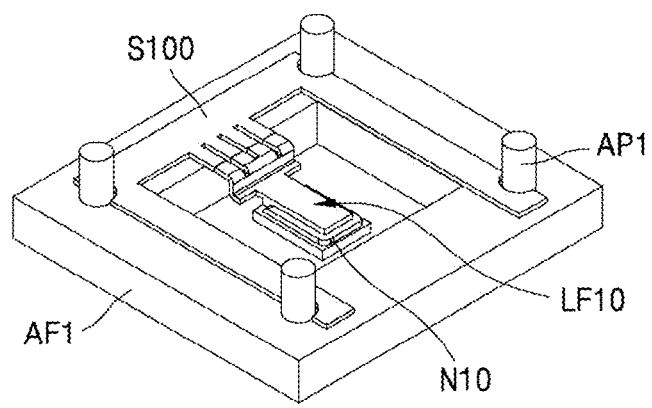
Figure 18B:
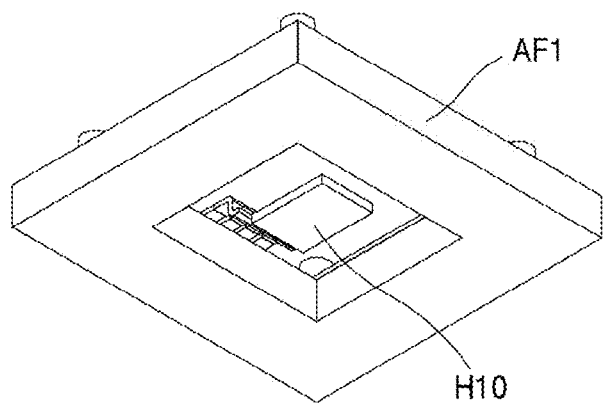

Referring to FIGS. 18A and 18B, an insulator N10 may be formed on a part of the first lead frame LF10. That is, the insulator N10 may be formed on the first portion (P10 of FIG. 1) around the second portion (P20 of FIG. 1) of the first lead frame LF10. The insulator N10 may be formed of resin. The resin may include at least one material selected from the group consisting of, for example, epoxy, liquid crystal polymer (LCP), polyimide (PI), polycarbonate (PC), polyethylene terephthalate (PET), etc. These materials may be electrically non-conductive. The insulator N10 may include the resin and additive/filler (that may or may not be predetermined). The additive/filler may function to increase thermal conductivity k of the insulator N10. In this connection, the insulator N10 may have a relatively high thermal conductivity. For example, the insulator N10 may have the thermal conductivity k equal to or higher than about 5 W/(m·K) or about 10 W/(m·K). The insulator N10 may be formed of a material having a coefficient of thermal expansion (CTE) similar to the first lead frame LF10.

Figure 19A:
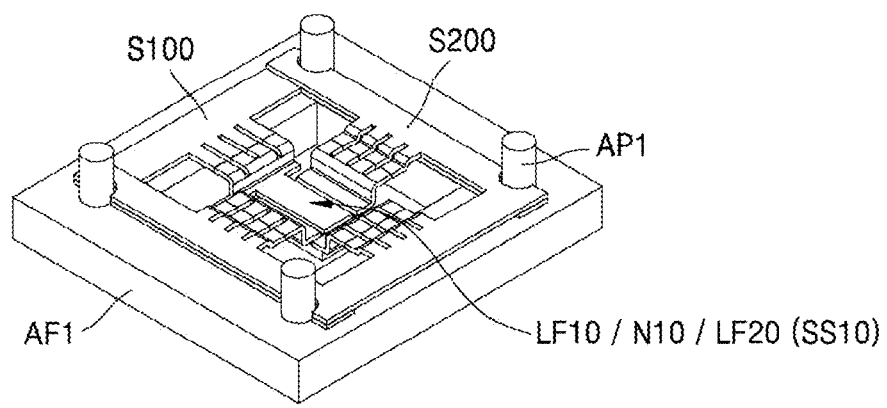
Figure 19B:
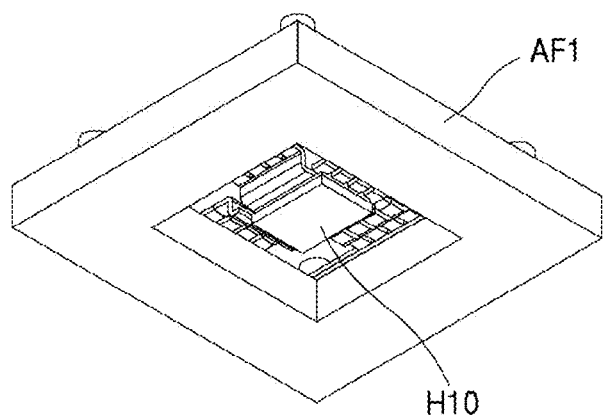

Referring to FIGS. 19A and 19B, a second structure S200 including a second lead frame LF20 may be loaded onto the alignment frame AF1. In this regard, the second lead frame LF20 may be coupled to the first lead frame LF10 with an insulator N10 disposed between the first and second lead frames LF10 and LF20. The insulator N10 may have adhesion, and thus may function to bond the first and second lead frames LF10 and LF20. Thereafter, the insulator N10 may be cured at a temperature (that may or may not be predetermined). Curing may be performed at a temperature between about 150° C. and about 200° C. A structure of coupling the first and second lead frames LF10 and LF20 may be a supporting structure SS10. The supporting structure SS10 may be a single "lead frame". The supporting structure SS10 may include a mounting region (that may or may not be predetermined). A second mounting region of the second lead frame LF20 may be provided around a first mounting region of the first lead frame LF10. A plurality of second mounting regions may be provided around the first mounting region. This may be the same as described with reference to FIG. 1.

Figure 20A:
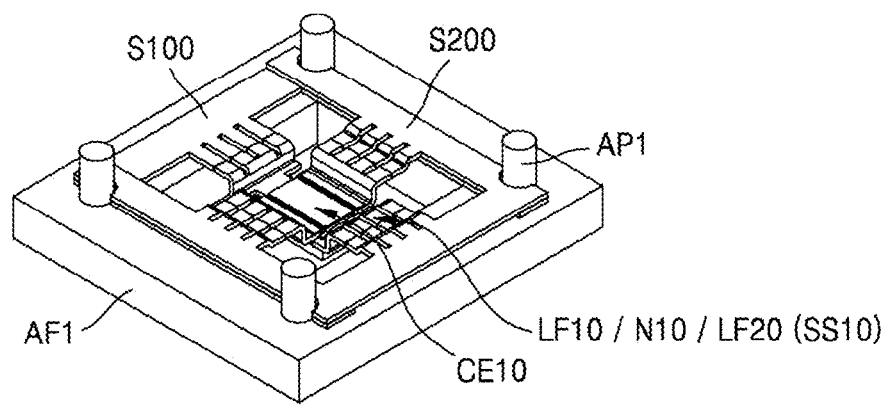
Figure 20B:
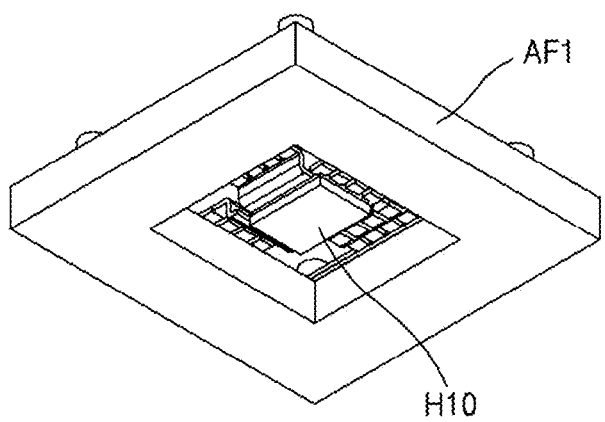

Referring to FIGS. 20A and 20B, a conductive connection element CE10 may be formed on the mounting region of the supporting structure SS10. The conductive connection element CE10 may have a configuration that is the same as or similar to that of the conductive connection element CE10 described with reference to FIG. 1. A method of forming the conductive connection element CE10 may include, for example, an operation of forming (coating) a solder paste by using a screen printing method, etc. However, this is an example, and may be modified in various ways.

Figure 21A:
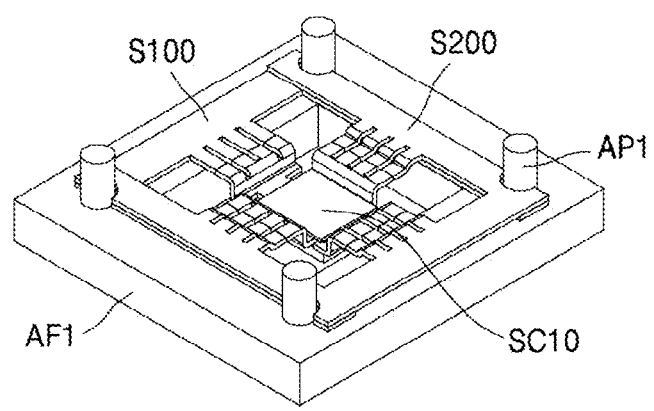
Figure 21B:
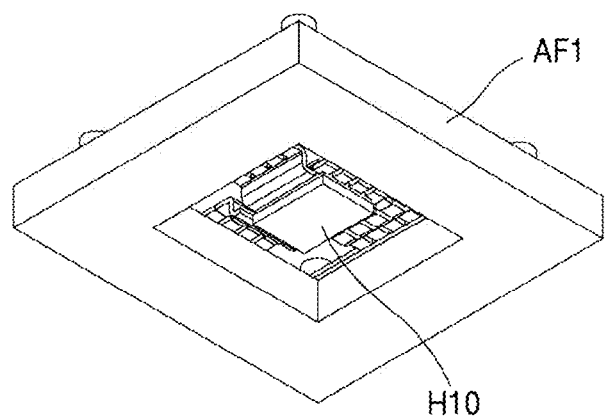

Referring to FIGS. 21A and 21B, a semiconductor chip element SC10 may be mounted on the conductive connection element (CE10 of FIG. 20A). That is, the semiconductor chip element SC10 may be mounted on the mounting region of the supporting structure (SS10 of FIG. 20A) in a flip-chip manner by using the conductive connection element CE10. The conductive connection element CE10 may have the same configuration as that of the conductive connection element CE10 described with reference to FIG. 1.

Figure 22A:
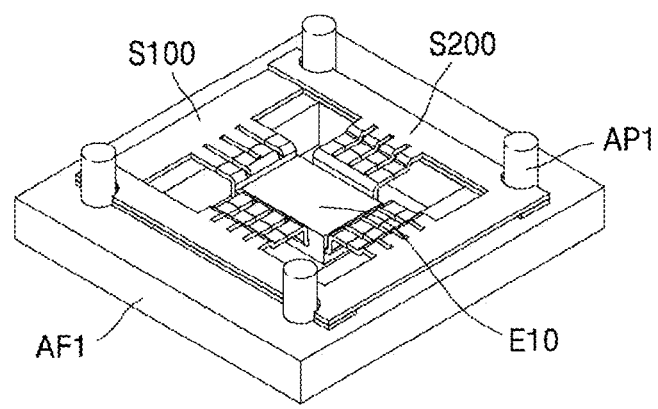
Figure 22B:
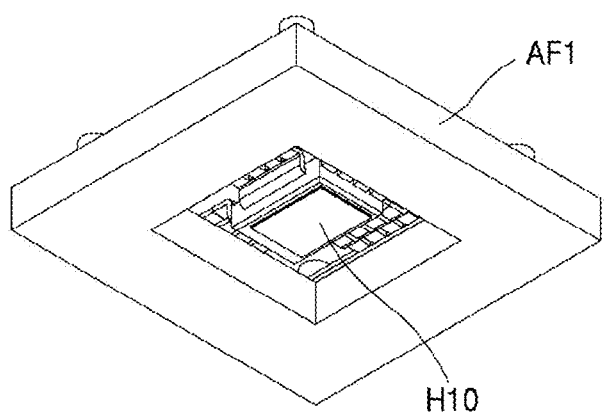

Referring to FIGS. 22A and 22B, an encapsulant E10 surrounding the semiconductor chip element (SC10 of FIG. 21A) may be formed. The encapsulant E10 may be an epoxy molding compound (EMC). Here, at least a portion of the heat dissipation element H10 of the supporting structure (SS10 of FIG. 19A) may be exposed by not being covered by the encapsulant E10.

Figure 23A:
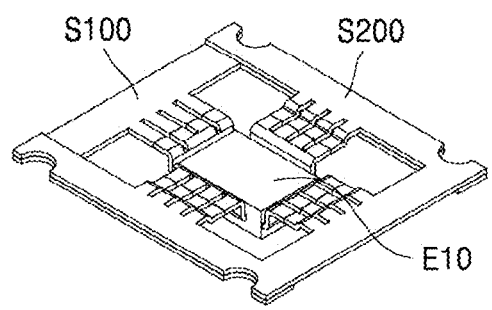
Figure 23B:
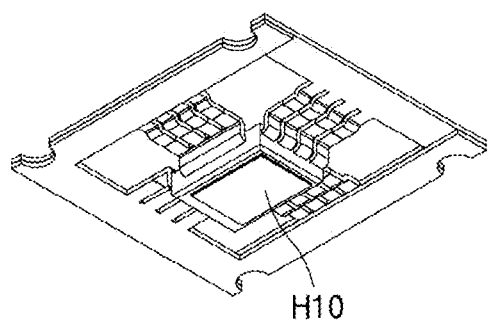

Referring to FIGS. 23A and 23B, the first and second structures S100 and S200 may be separated from the alignment frame AF1.

Figure 24A:
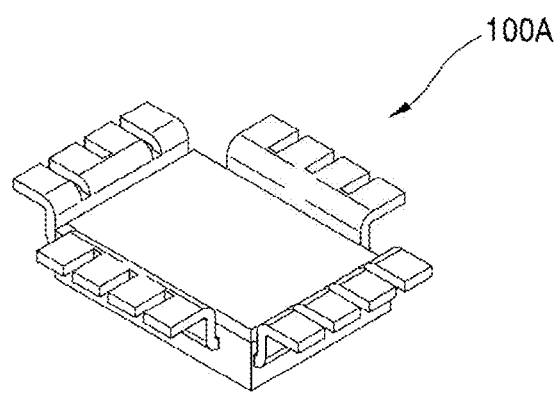
Figure 24B:
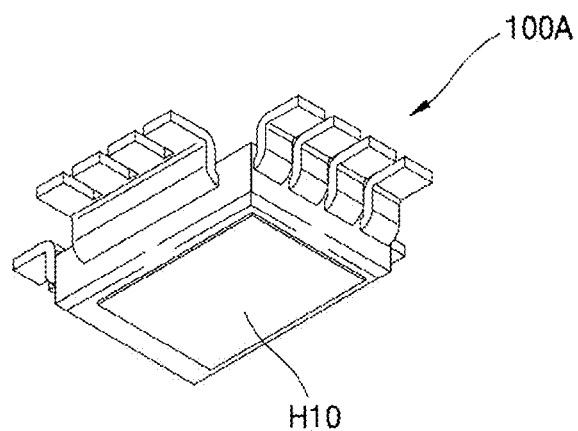

Referring to FIGS. 24A and 24B, a semiconductor device package 100A may be obtained by cutting out peripheral portions of the first and second structures S100 and S200 and finalizing process. Thereafter, although not shown, the semiconductor device package 100A may be mounted on a printed circuit board (PCB) (that may or may not be predetermined) (see FIG. 9). As necessary, the semiconductor device package 100A may further include an external heat sink contacting an exposed surface of the heat dissipation element H10 (see FIG. 10).

Figure 25:
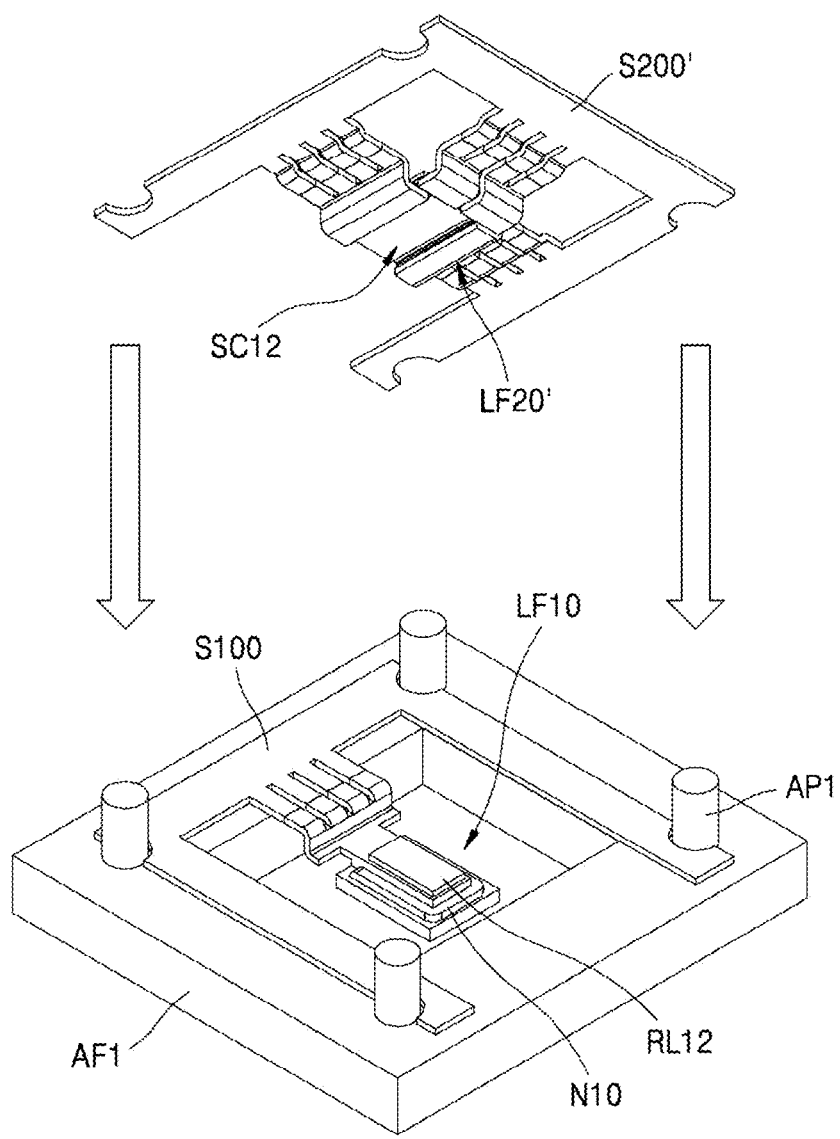
FIG. 25 is a perspective view for explaining a method of manufacturing a semiconductor device package, according to some example embodiments.

FIG. 25 is a perspective view for explaining a method of manufacturing a semiconductor device package, according to some example embodiments.

Referring to FIG. 25, a first structure S100 including a first lead frame LF10 may be loaded onto an alignment frame AF1. In this regard, the first lead frame LF10 may have a configuration that is the same as or similar to that of the first lead frame LF10 described with reference to FIG. 1. Thus, the first lead frame LF10 may include the heat dissipation element (H10 of FIG. 1).

Thereafter, a second structure S200' including a second lead frame LF20' may be prepared. Here, the second lead frame LF20' may have a configuration that is the same as or similar to that of the second lead frame LF20' described with reference to FIG. 3. Thereafter, a semiconductor chip element SC12 may be mounted on a mounting region of the second lead frame LF20'. A conductive connection element (that may or may not be predetermined) may be provided between the second lead frame LF20' and the semiconductor chip element SC12. The conductive connection element may correspond to, for example, the conductors SD12-1, SD12-2, SD12-3, and SD12-4 of FIG. 3. An operation of forming the conductive connection element and the semiconductor chip element SC12 on the second structure S200' may be performed in an alignment frame (that may or may not be predetermined) (not shown). The alignment frame (that may or may not be predetermined) may be the same as the alignment frame AF1 of FIG. 16A.

A resin layer RL12 may be formed on a mounting region (a first mounting region) of the first lead frame LF10. An insulator N10 may be formed on the first lead frame LF10 around the first mounting region. A material and characteristic of the resin layer RL12 may be the same as or similar to those of the resin layer RL12 described with reference to FIG. 3. A material and characteristic of the insulator N10 may be the same as or similar to those of the insulator N10 described with reference to FIG. 1. Although the resin layer RL12 may be formed in a shape of a plate or a film in this regard, the shape of the resin layer RL12 may be modified in various ways.

Thereafter, the second structure S200' may be coupled to the first structure S100. In this regard, the first lead frame LF10 and the second lead frame LF20' may be coupled to each other with the insulator N10 disposed therebetween. The semiconductor chip element SC12 may be mounted on the resin layer RL12. The resin layer RL12 and the insulator N10 may be slightly fluidic, and thus when the semiconductor chip element SC12 and the second lead frame LF20' are adhered to the first lead frame LF10, shapes of the resin layer RL12 and the insulator N10 may be properly modified according to an adhesion pressure. Thereafter, if necessary, a curing process (that may or may not be predetermined) may be performed on the resin layer RL12 and the insulator N10.

Thereafter, although not shown, after the coupled first and second structures S100 and S200' are separated from the alignment frame AF1, a semiconductor device package may be manufactured by performing cutting and finalizing operations. The semiconductor device package manufactured as described above may have a structure as described with reference to FIG. 3.

The method of manufacturing the semiconductor device package according to some example embodiments as described with reference to FIGS. 16A, 16B, 17A, 17B, 18A, 18B, 19A, 19B, 20A, 20B, 21A, 21B, 22A, 22B, 23A, 23B, 24A, 24B, and 25 may be performed by slightly modifying an existing lead frame package manufacturing equipment/process, and thus the method may be applied in a low cost without large burden for new equipment investment. The structures of the lead frames LF10, LF20, and LF20' or the structure of the conductive connection element CE10, and the configuration of the semiconductor chip element SC10 are examples according to some example embodiments, and may be modified in various ways.

Figure 26A:
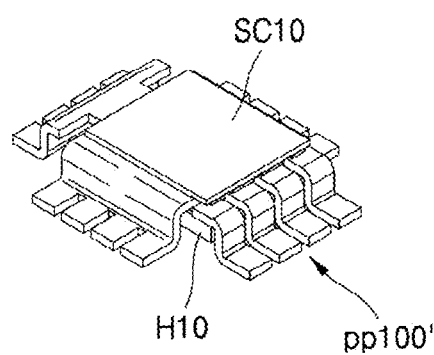
FIGS. 26A and 26B are perspective views of a semiconductor device package, according to some example embodiments.
Figure 26B:
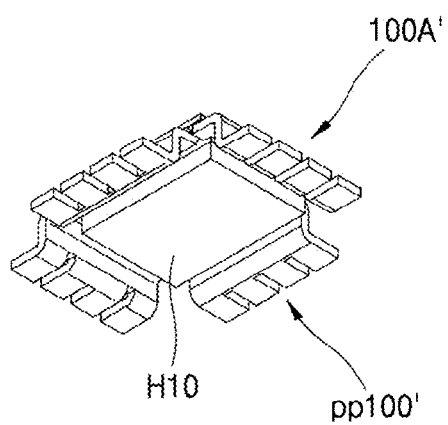
Figure 27A:
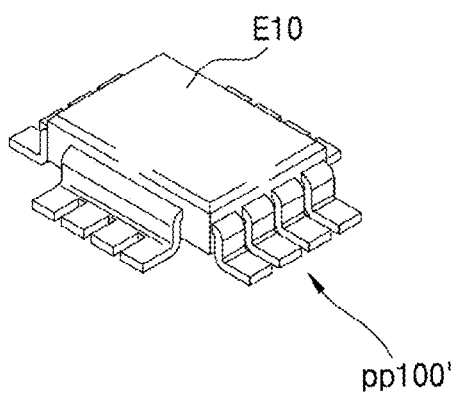
FIGS. 27A and 27B are perspective views of a package structure in which an encapsulant for protecting a semiconductor chip element is provided to the semiconductor device package of FIGS. 26A and 26B.
Figure 27B:
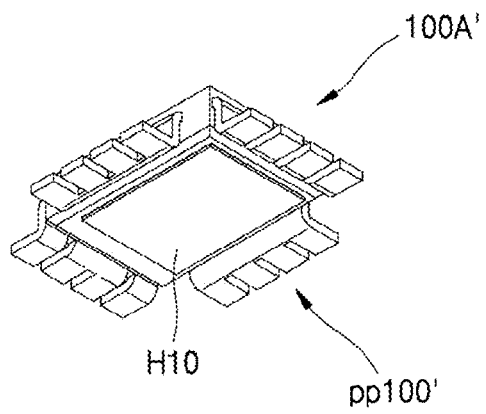

According to some example embodiments, a shape/direction of the pin structure pp100 may be modified in the structures of FIGS. 7 and 8. In FIGS. 7 and 8, contact surfaces of connection pins of the pin structure pp100 are provided to face a direction in which the semiconductor chip element SC10 is formed with respect to the heat dissipation element H10. That is, the connection pins may be curved toward the semiconductor chip element SC10, and may be provided to face in an opposite direction to that in which the heat dissipation element H10 is exposed. According to some example embodiments, the contact surfaces of the connection pins may be provided to face in a direction in which the heat dissipation element H10 is formed with respect to the semiconductor chip element SC10. Examples shown in FIGS. 26A, 26B, 27A, and 27B. FIGS. 26A and 27A are perspective views taken from above a semiconductor device package. FIGS. 26B and 27B are perspective views taken from below the semiconductor device package.

Referring to FIGS. 26A, 26B, 27A, and 27B, contact surfaces of connection pins of a pin structure pp100' are provided to face in a direction in which the heat dissipation element H10 is formed with respect to the semiconductor chip element SC10. A semiconductor device package 100A' of FIGS. 27A and 27B further includes the encapsulant E10 compared to the semiconductor device package of FIGS. 26A and 26B.

Figure 28:
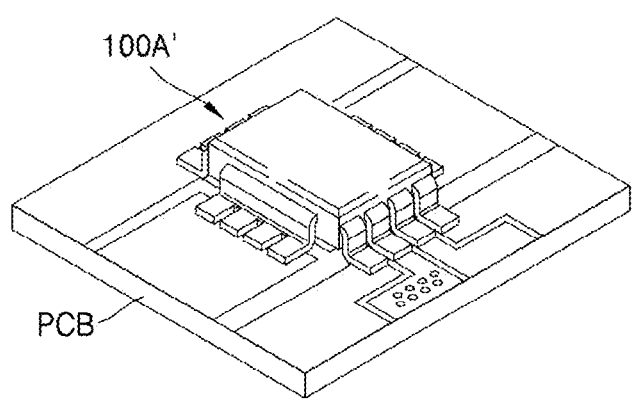
FIG. 28 is a perspective view of the semiconductor device package of FIGS. 27A and 27B mounted on a PCB.

FIG. 28 is a perspective view of the semiconductor device package 100A' of FIGS. 27A and 27B mounted on a PCB. In this regard, the heat dissipation element H10 of FIG. 27B may be disposed to face the PCB. An exposed surface of the heat dissipation element (H10 of FIG. 27B) may contact the PCB.

It should be understood that the example embodiments described herein should be considered in a descriptive sense only and not for purposes of limitation. For example, it will be understood by those of ordinary skill in the art that the structure of the semiconductor device package illustrated in FIGS. 1 through 11 and FIGS. 26A, 26B, 27A, 27B, and 28 may be modified in various ways. As an example, it will be understood by those of ordinary skill in the art that the structures of the first lead frame LF10 and the second lead frames LF20 and LF20' may be modified in various ways, and the configurations of the conductive connection elements CE10, CE11, and CE12 and the semiconductor chip elements SC10, SC11, and SC12 may be modified in various ways. Furthermore, it will be understood by those of ordinary skill in the art that the method of manufacturing the semiconductor device package described with reference to FIGS. 16A, 16B, 17A, 17B, 18A, 18B, 19A, 19B, 20A, 20B, 21A, 21B, 22A, 22B, 23A, 23B, 24A, 24B, and 25 may be modified in various ways. The semiconductor device package may be variously applied to various semiconductor devices in addition to a power device, a power system, and a power module.

It should be understood that example embodiments described herein should be considered in a descriptive sense only and not for purposes of limitation. Descriptions of features or aspects within example embodiments should typically be considered as available for other similar features or aspects in other example embodiments.

What is claimed is:

1. A semiconductor device package, comprising:
   a semiconductor chip element; and
   a supporting structure on which the semiconductor chip element is mounted and comprising an electrical connection element for connecting the semiconductor chip element to an external terminal;
   wherein the supporting structure comprises:
      a first lead frame comprising a heat dissipation element;
      a second lead frame coupled to the first lead frame; and
      an insulator configured to electrically insulate the first and second lead frames from each other;
   wherein each of the first and second lead frames comprises a mounting region on which the semiconductor chip element is mounted,
   wherein the first lead frame comprises:
      a first portion; and
      a second portion on the first portion and having a smaller width than that of the first portion,
   wherein the insulator is on the first portion around the second portion,
   wherein the second lead frame is on the insulator, and
   wherein the insulator is not an encapsulant, and the insulator does not contact a top surface of the second lead frame facing the semiconductor chip element.

2. The semiconductor device package of claim 1, wherein the semiconductor chip element is on one side with respect to the first and second lead frames.

3. The semiconductor device package of claim 1, wherein a part of the first lead frame overlaps with a part of the second lead frame.

4. The semiconductor device package of claim 1, wherein a part of the second lead frame is between the first lead frame and the semiconductor chip element.

5. The semiconductor device package of claim 1,
   wherein the second lead frame comprises a plurality of frame elements around the second portion of the first lead frame, and
   wherein the plurality of frame elements are electrically separated from each other.

6. The semiconductor device package of claim 5, wherein the plurality of frame elements comprises;
   first and second frame elements facing each other with the second portion of the first lead frame between the first and second frame elements; and
   a third frame element on one side with respect to the first and second frame elements.

7. The semiconductor device package of claim 1, wherein the insulator comprises:
   a first portion extending in a first direction;
   a second portion spaced apart from the first portion and in parallel to the first portion; and
   a third portion configured to connect an end of the first portion and an end of the second portion.

8. The semiconductor device package of claim 1, wherein the insulator comprises resin.

9. The semiconductor device package of claim 8, wherein the resin comprises at least one of epoxy, liquid crystal polymer (LCP), polyimide (PI), polycarbonate (PC), and polyethylene terephthalate (PET).

10. The semiconductor device package of claim 1, wherein the semiconductor chip element is mounted on the supporting structure in a flip-chip manner.

11. The semiconductor device package of claim 1,
    wherein the first lead frame comprises a first mounting region of the mounting regions, and
    wherein the second lead frame comprises a plurality of second mounting regions of the mounting regions around the first mounting region.

12. The semiconductor device package of claim 11,
    wherein at least one first conductor is on the first mounting region,
    wherein a plurality of second conductors are on the plurality of second mounting regions, and
    wherein the semiconductor chip element is mounted on the at least one first conductor and second conductors.

13. The semiconductor device package of claim 11,
    wherein the insulator comprises a resin layer,
    wherein the resin layer is on the first mounting region,
    wherein a plurality of conductors are on the plurality of second mounting regions, and
    wherein the semiconductor chip element is mounted on the resin layer and the plurality of conductors.

14. The semiconductor device package of claim 13, wherein the resin layer has thermal conductivity greater than or equal to about 5 W/(m·K).

15. The semiconductor device package of claim 1, wherein the semiconductor chip element is configured as a single chip.

16. The semiconductor device package of claim 15, wherein the single chip has a structure in which a plurality of devices are monolithically integrated on a single substrate.

17. The semiconductor device package of claim 1, wherein the semiconductor chip element comprises a plurality of chips.

18. The semiconductor device package of claim 1, further comprising:
    an encapsulant covering the semiconductor chip element and a portion of the supporting structure;
    wherein at least a portion of the heat dissipation element is not covered by the encapsulant so as to be exposed.

19. The semiconductor device package of claim 18, further comprising:
    an external heat sink;
    wherein the external heat sink is configured to contact an exposed portion of the heat dissipation element that is not covered by the encapsulant.

20. The semiconductor device package of claim 1,
    wherein the supporting structure comprises a plurality of connection pins, and
    wherein the plurality of connection pins are such that contact surfaces of the plurality of connection pins face a direction in which the semiconductor chip element is formed with respect to the heat dissipation element.

21. The semiconductor device package of claim 1,
    wherein the supporting structure comprises a plurality of connection pins, and
    wherein the plurality of connection pins are such that contact surfaces of the plurality of connection pins face a direction in which the heat dissipation element is formed with respect to the semiconductor chip element.

22. The semiconductor device package of claim 1, wherein the semiconductor chip element comprises a power device.

23. The semiconductor device package of claim 1, wherein the semiconductor chip element comprises a gallium nitride based device on a silicon substrate.

24. A semiconductor device package, comprising:
- a semiconductor chip element, a supporting structure on which the semiconductor chip element is mounted, and a conductive connection element;
- wherein the semiconductor chip element comprises a silicon substrate and a Group III-V based device unit on the silicon substrate,
- wherein the supporting structure comprises a heat dissipation element,
- wherein the conductive connection element is between the heat dissipation element and the Group III-V based device unit,
- wherein the Group III-V based device unit is between the conductive connection element and the silicon substrate,
- wherein the supporting structure further comprises:
  - a first lead frame comprising the heat dissipation element;
  - a second lead frame coupled to the first lead frame; and
  - an insulator between the first and second lead frames;
- wherein the first lead frame comprises:
  - a first portion; and
  - a second portion on the first portion and having a smaller width than that of the first portion;
- wherein the insulator is on the first portion around the second portion,
- wherein the second lead frame is on the insulator, and
- wherein the insulator is not an encapsulant, and the insulator does not contact a top surface of the second lead frame facing the semiconductor chip element.

25. The semiconductor device package of claim 24,
- wherein the first lead frame comprises a first mounting region,
- wherein the second lead frame comprises a plurality of second mounting regions around the first mounting region, and
- wherein the semiconductor chip element is mounted on the first mounting region and the plurality of second mounting regions.

* * * * *